(12) United States Patent
Khang et al.

(10) Patent No.: US 10,224,204 B1
(45) Date of Patent: Mar. 5, 2019

(54) METHOD OF MANUFACTURING INTEGRATED CIRCUIT DEVICE

(71) Applicant: SAMSUNG ELECTRONICS CO., LTD., Suwon-si, Gyeonggi-Do (KR)

(72) Inventors: Dong-Hoon Khang, Daegu (KR);
Dong-Woo Kang, Ansan-si (KR);
Moon-Han Park, Yongin-si (KR);
Ji-Ho Yoo, Seongnam-si (KR);
Chong-Kwang Chang, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/891,391

(22) Filed: Feb. 8, 2018

(30) Foreign Application Priority Data

Aug. 10, 2017 (KR) .................. 10-2017-0101714

(51) Int. Cl.
| | |
|---|---|
| *H01L 21/266* | (2006.01) |
| *H01L 21/8238* | (2006.01) |
| *H01L 21/311* | (2006.01) |
| *H01L 21/768* | (2006.01) |

(52) U.S. Cl.
CPC ...... *H01L 21/266* (2013.01); *H01L 21/31144* (2013.01); *H01L 21/823821* (2013.01); *H01L 21/823828* (2013.01); *H01L 21/823892* (2013.01); *H01L 21/76814* (2013.01); *H01L 21/76831* (2013.01)

(58) Field of Classification Search
CPC ........... H01L 21/7681; H01L 21/76814; H01L 21/76831; H01L 21/31116; H01L 21/76816; H01L 21/76802; H01L 21/266; H01L 21/823828; H01L 21/31144; H01L 21/823821; H01L 21/823892
See application file for complete search history.

(56) References Cited

U.S. PATENT DOCUMENTS

| | | |
|---|---|---|
| 8,158,524 B2 | 4/2012 | Chi et al. |
| 8,987,836 B2 | 3/2015 | Kim et al. |
| 9,076,738 B2 | 7/2015 | Watanabe et al. |
| 9,136,121 B2 | 9/2015 | Hatakeyama et al. |
| 9,362,133 B2 | 6/2016 | Shamma et al. |
| 9,559,192 B1 | 1/2017 | Lee |

(Continued)

FOREIGN PATENT DOCUMENTS

| | | |
|---|---|---|
| KR | 10-2017-005823 A | 5/2017 |
| KR | 10-2017-0058232 A | 5/2017 |

*Primary Examiner* — Thanh T Nguyen
(74) *Attorney, Agent, or Firm* — Volentine, Whitt & Francos, PLLC

(57) ABSTRACT

An integrated circuit device is manufactured by a method including forming a stacked mask structure including a carbon-containing film and a silicon-containing organic anti-reflective film is on a substrate, forming a silicon-containing organic anti-reflective pattern by etching the silicon-containing organic anti-reflective film, and forming a composite mask pattern including a carbon-containing mask pattern and a profile control liner lining interior surfaces of the carbon-containing mask pattern by etching the carbon-containing film while using the silicon-containing organic anti-reflective pattern as an etch mask. Ions are implanted into the substrate through a plurality of spaces defined by the composite mask pattern.

20 Claims, 27 Drawing Sheets

(56) References Cited

U.S. PATENT DOCUMENTS

| | | | |
|---|---|---|---|
| 2009/0072401 A1* | 3/2009 | Arnold | H01L 21/76808 257/751 |
| 2009/0215658 A1* | 8/2009 | Minsek | C09G 1/02 510/175 |
| 2010/0301491 A1* | 12/2010 | Yang | H01L 21/02063 257/773 |
| 2011/0143542 A1* | 6/2011 | Feurprier | H01L 21/02063 438/700 |
| 2011/0159697 A1 | 6/2011 | Mukawa | |
| 2012/0031875 A1 | 2/2012 | Hosoya et al. | |
| 2016/0027645 A1 | 1/2016 | Shin et al. | |
| 2017/0140997 A1 | 5/2017 | Pae et al. | |

* cited by examiner

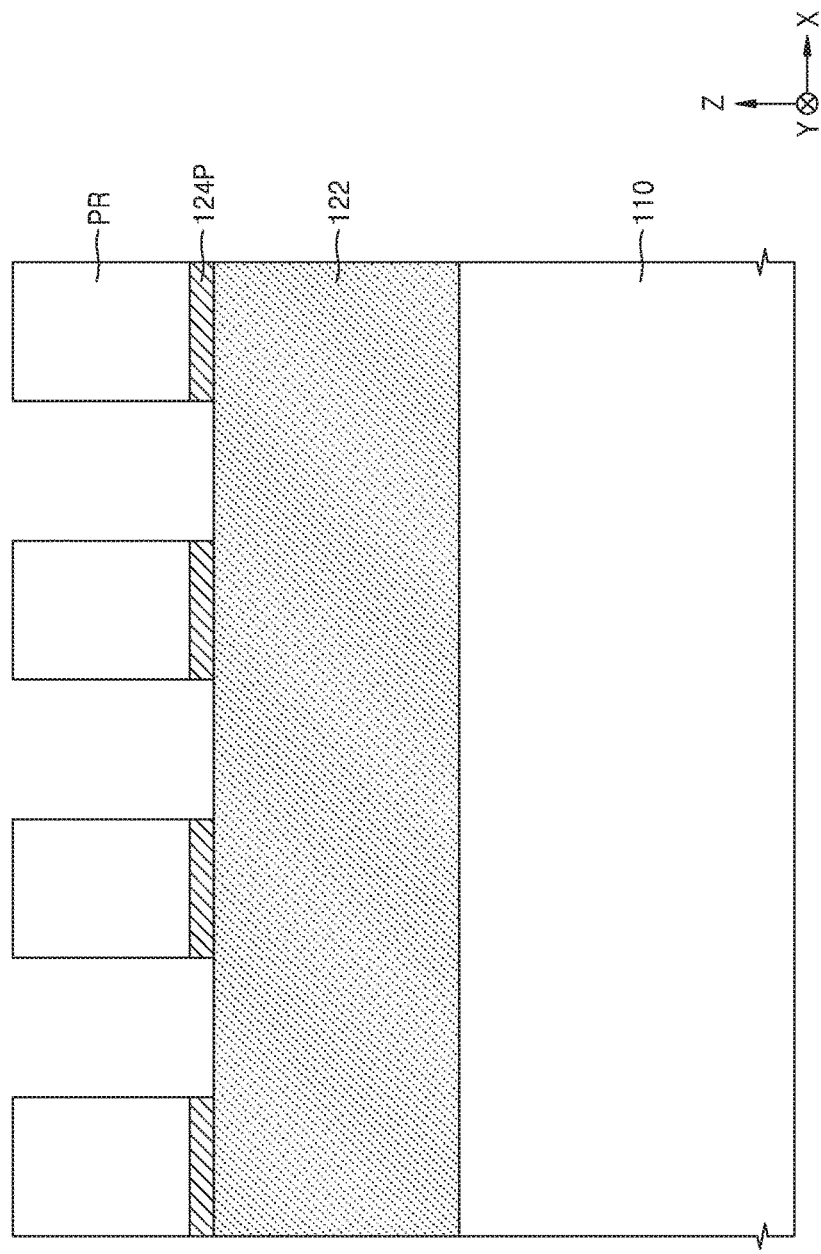

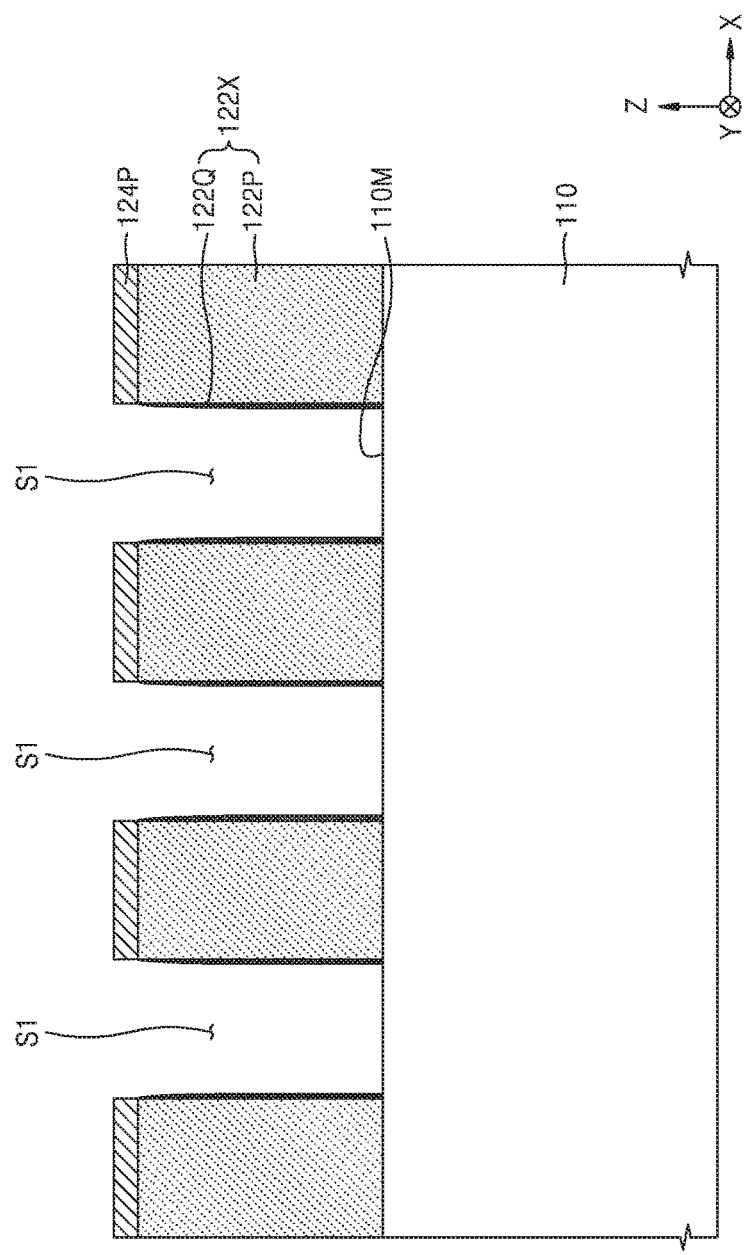

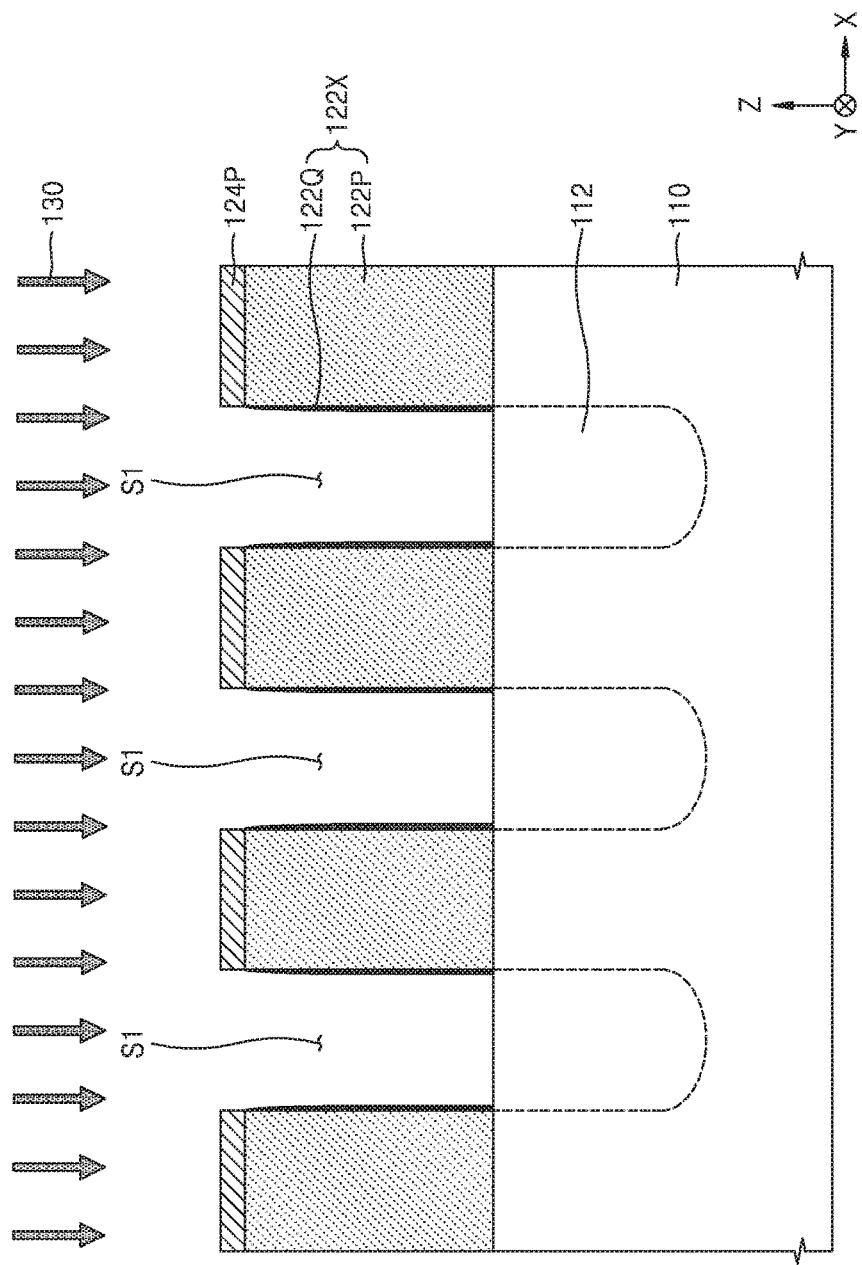

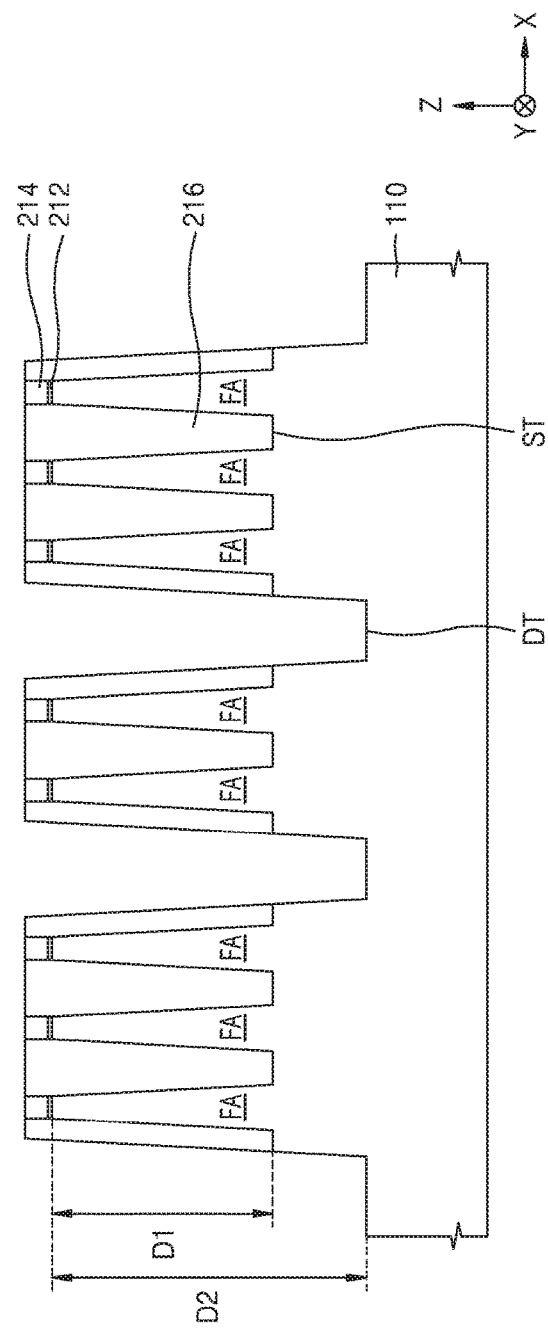

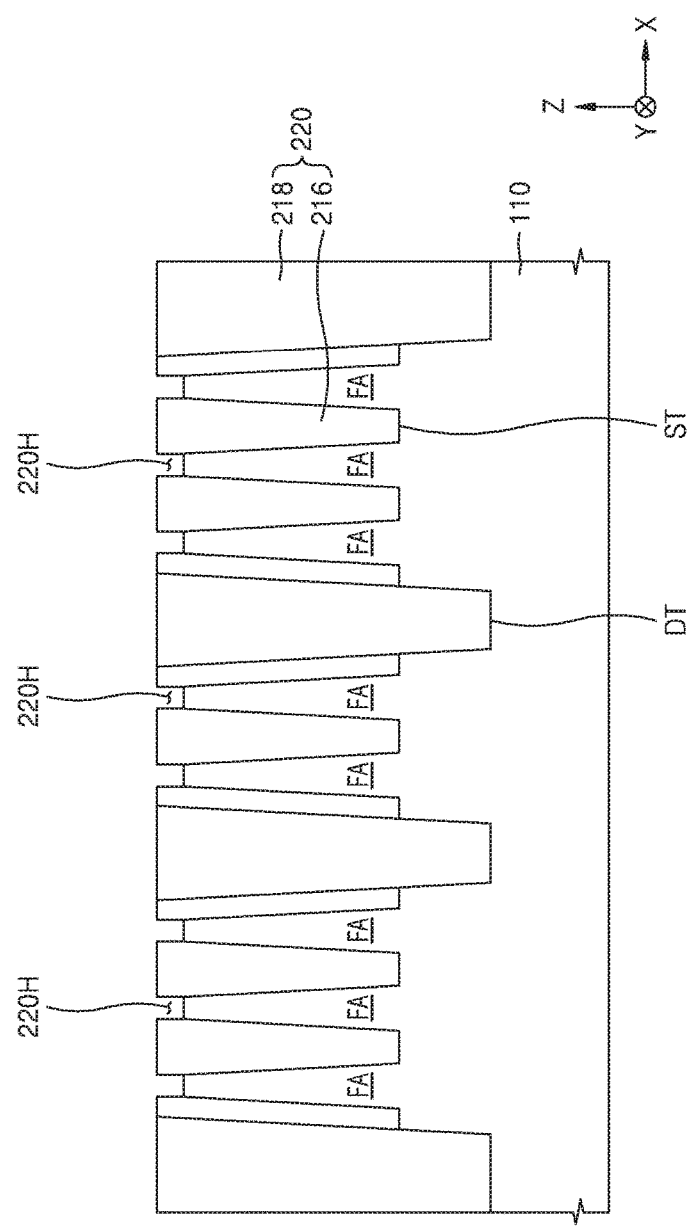

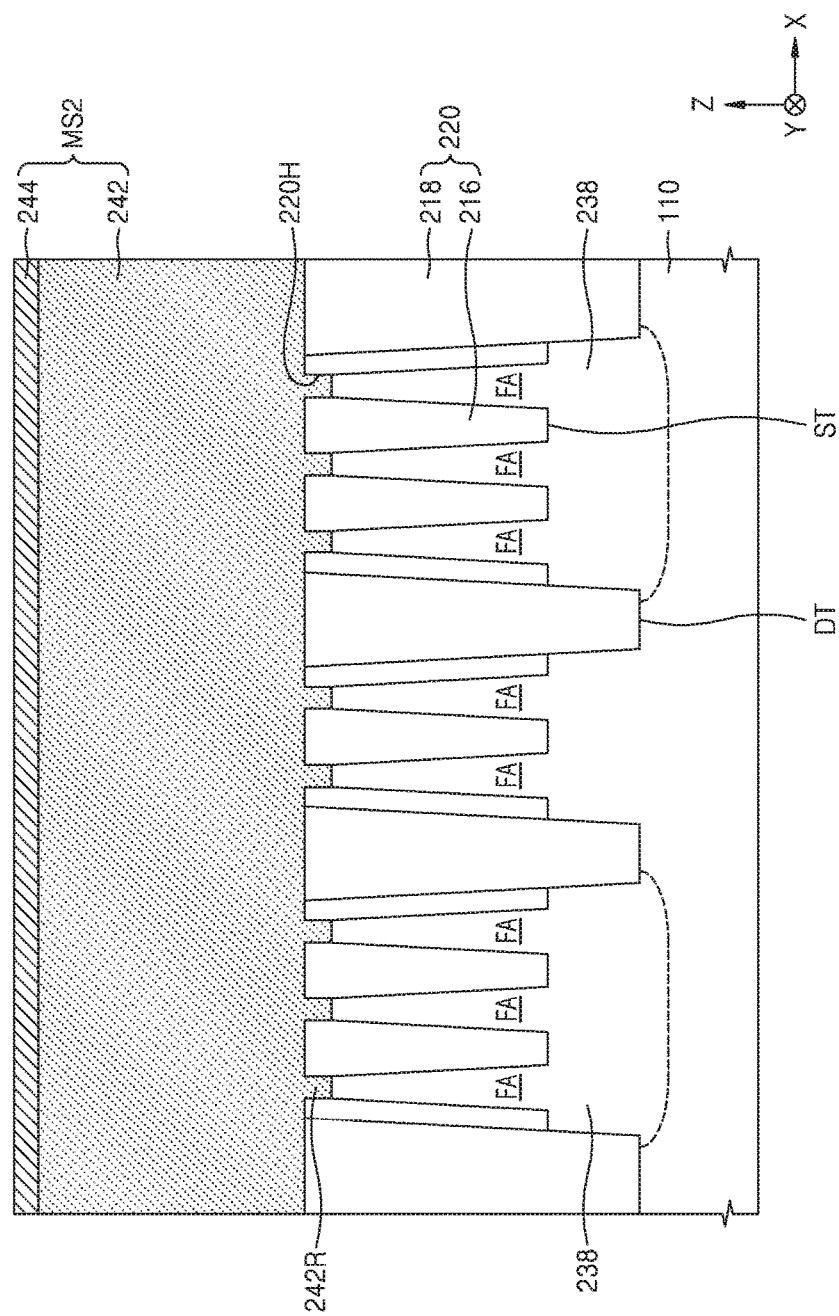

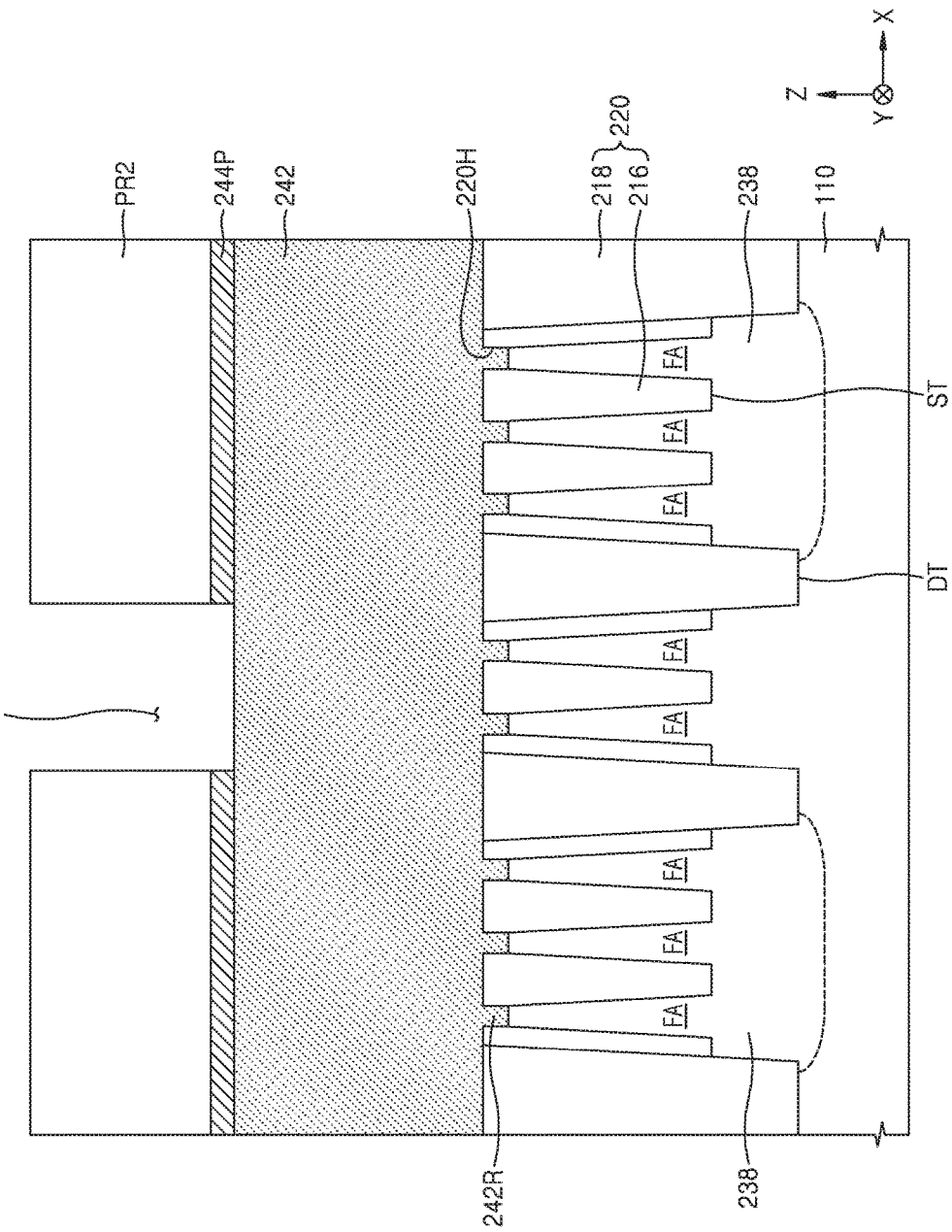

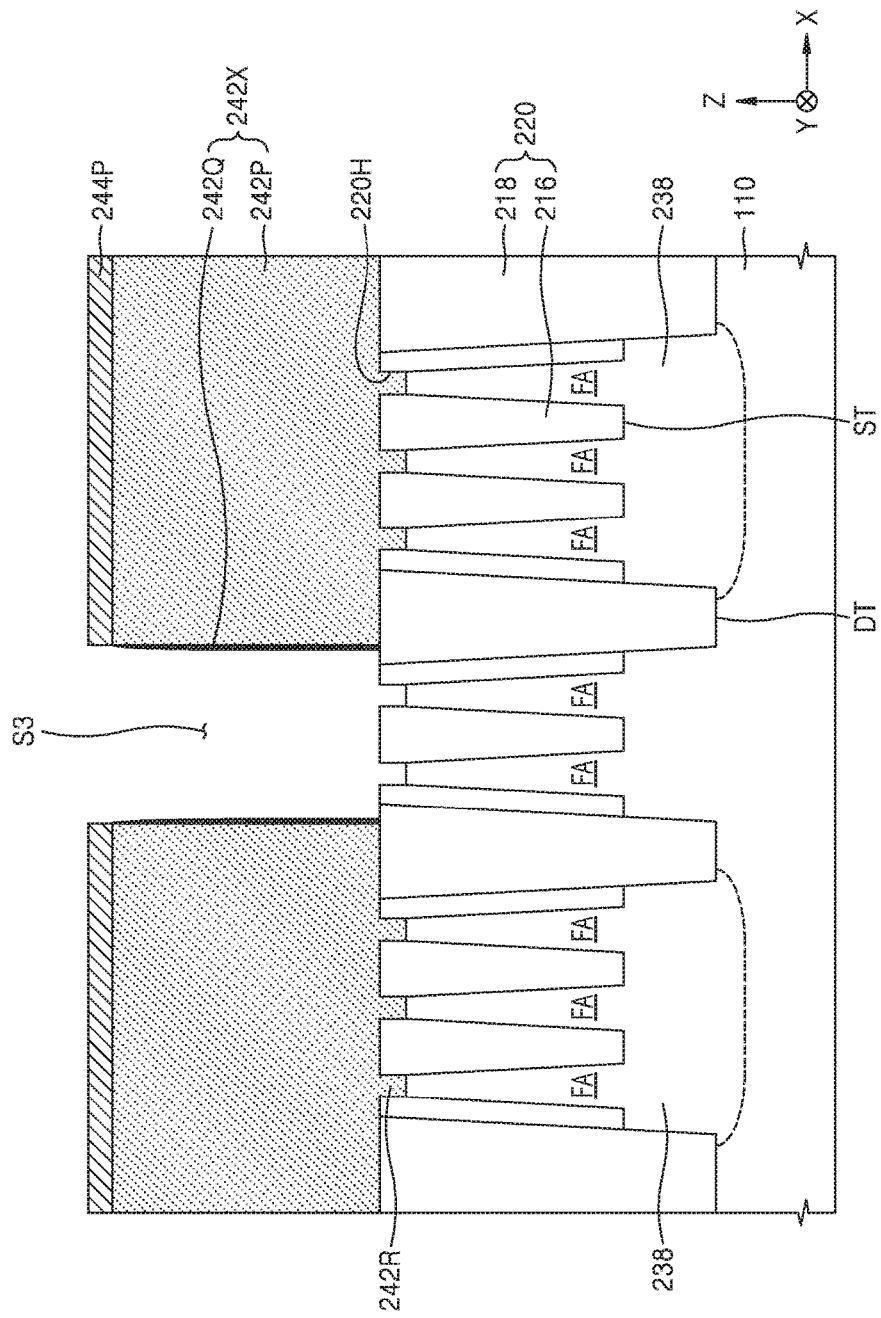

METHOD OF MANUFACTURING INTEGRATED CIRCUIT DEVICE

PRIORITY STATEMENT

This application claims the benefit of Korean Patent Application No. 10-2017-0101714, filed on Aug. 10, 2017, in the Korean Intellectual Property Office, the disclosure of which is hereby incorporated by reference in its entirety.

BACKGROUND

The inventive concept relates to a method of manufacturing an integrated circuit device, and more particularly, to a method of manufacturing an integrated circuit device having fine line-width patterns.

In connection with the current trend of down-scaling integrated circuit devices, smaller design rules are required if the devices are to remain highly integrated. Among the unit features or patterns of integrated circuit devices having a fine critical dimension (CD) in compliance with such reduced design rules are those formed by an ion implantation process through an ion implantation mask having openings of dimensions corresponding to the CD of the unit features or patterns. Conventionally, a photoresist pattern is used as the ion implantation mask. However, there are limits to the resolution of the photolithography process by which such a mask can be formed. Therefore, the use of a photoresist pattern as an ion implantation mask makes it is difficult to ensure the dimensional accuracy of the patterns or unit features to be formed when manufacturing a miniaturized and highly integrated circuit device.

SUMMARY

The inventive concept provides a method of manufacturing an integrated circuit device, the method including forming a carbon-containing film on a substrate, forming a silicon-containing organic anti-reflective film on the carbon-containing film, whereby a stacked mask structure constituted by the carbon-containing film and the silicon-containing organic anti-reflective film is formed on the substrate, etching the silicon-containing organic anti-reflective film to thereby form a silicon-containing organic anti-reflective pattern that exposes a select portion of the carbon-containing film, etching the carbon-containing film using the silicon-containing organic anti-reflective pattern as an etch mask to form a composite mask comprising a carbon-containing mask pattern defining openings therethrough and a profile control liner covering side surfaces of the carbon-containing mask pattern that delimit the openings, and implanting ions as an impurity into the substrate through a plurality of spaces defined by the composite mask.

The inventive concept also provides a method of manufacturing an integrated circuit device, the method including forming a stacked mask structure on a plurality of active areas of a substrate, the stacked mask structure comprising a carbon-containing film and a silicon-containing organic anti-reflective film, forming a silicon-containing organic anti-reflective pattern by etching the silicon-containing organic anti-reflective film, forming a composite mask comprising a carbon-containing mask pattern defining openings therethrough and a profile control liner covering side surfaces of the carbon-containing mask pattern that delimit the openings, wherein the composite mask is formed by etching the carbon-containing film using the silicon-containing organic anti-reflective pattern as an etch mask, implanting ions as an impurity into some of the plurality of active areas using the composite mask as an ion implantation mask, and removing the silicon-containing organic anti-reflective pattern and the composite mask.

The inventive concept still further provides a method of manufacturing an integrated circuit device, the method including forming fin-type active areas extending parallel to each other in a first horizontal direction, wherein the fin-type active areas are formed by etching a portion of a substrate, forming an insulating film filling spaces between adjacent ones of the fin-type active areas, forming a stacked mask structure on the insulating film and the plurality of fin-type active areas, wherein the stacked mask structure comprises a carbon-containing film and a silicon-containing organic anti-reflective film, forming a silicon-containing organic anti-reflective pattern by etching the silicon-containing organic anti-reflective film, forming a composite mask comprising a carbon-containing mask pattern defining openings therethrough and a profile control liner covering side surfaces of the carbon-containing mask pattern that delimit the openings, wherein the composite mask is formed by etching the carbon-containing film using the silicon-containing organic anti-reflective pattern as an etch mask, and forming a well in the plurality of fin-type active areas by implanting ions as an impurity ion into some of the plurality of fin-type active areas using the composite mask as an ion implantation mask.

BRIEF DESCRIPTION OF THE DRAWINGS

The inventive concept will be more clearly understood from the following detailed description of examples thereof taken in conjunction with the accompanying drawings in which:

FIGS. 2A, 2B, 2C, 2D, 2E and 2F are cross-sectional views of an integrated circuit device during the course of a process sequence in its manufacture and together illustrate examples of a method of manufacturing an integrated circuit device according to the inventive concept;

FIGS. 3A, 3B, 3C, 3D, 3E, 3F, 3G, 3H, 3I, 3J, 3K, 3L, 3M, 3N, 3O, 3P, 3Q and 3R are cross-sectional views of an integrated circuit device during the course of a process sequence in its manufacture and together illustrate examples of a method of manufacturing an integrated circuit device according to the inventive concept;

DETAILED DESCRIPTION

Figure 1:
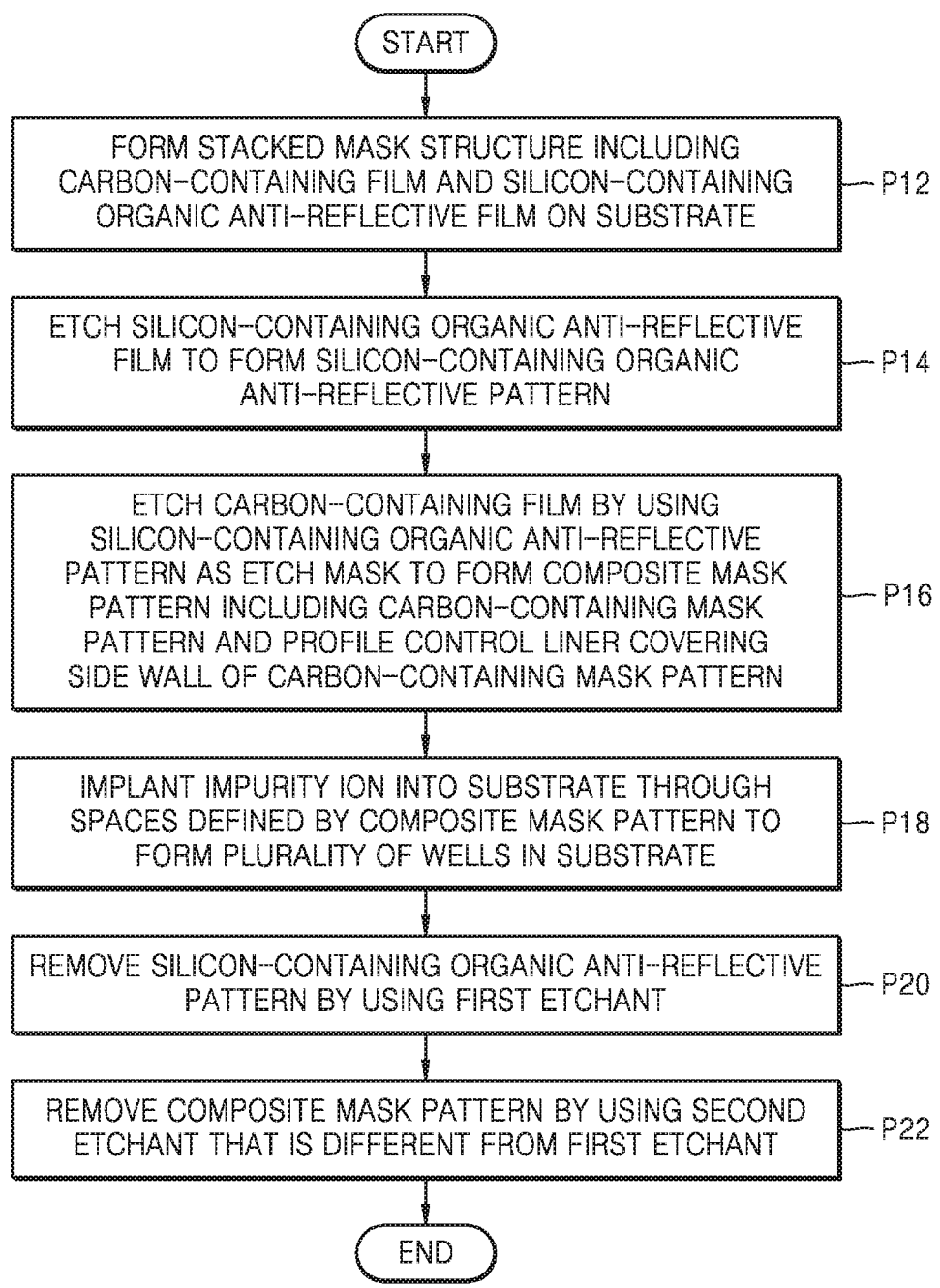
FIG. 1 shows a flowchart illustrating examples of a method of manufacturing an integrated circuit device according to the inventive concept.

Hereinafter, examples of the inventive concept will be described in detail with reference to the accompanying drawings. The same reference numerals are used for the same elements in the drawings, and a duplicate description thereof will be omitted.

FIG. 1 shows a flowchart illustrating a method of manufacturing an integrated circuit device according to the inventive concept.

FIGS. 2A to 2F are cross-sectional views illustrating, in accordance with a process sequence, a method of manufacturing an integrated circuit device according to the inventive concept.

Figure 2A:
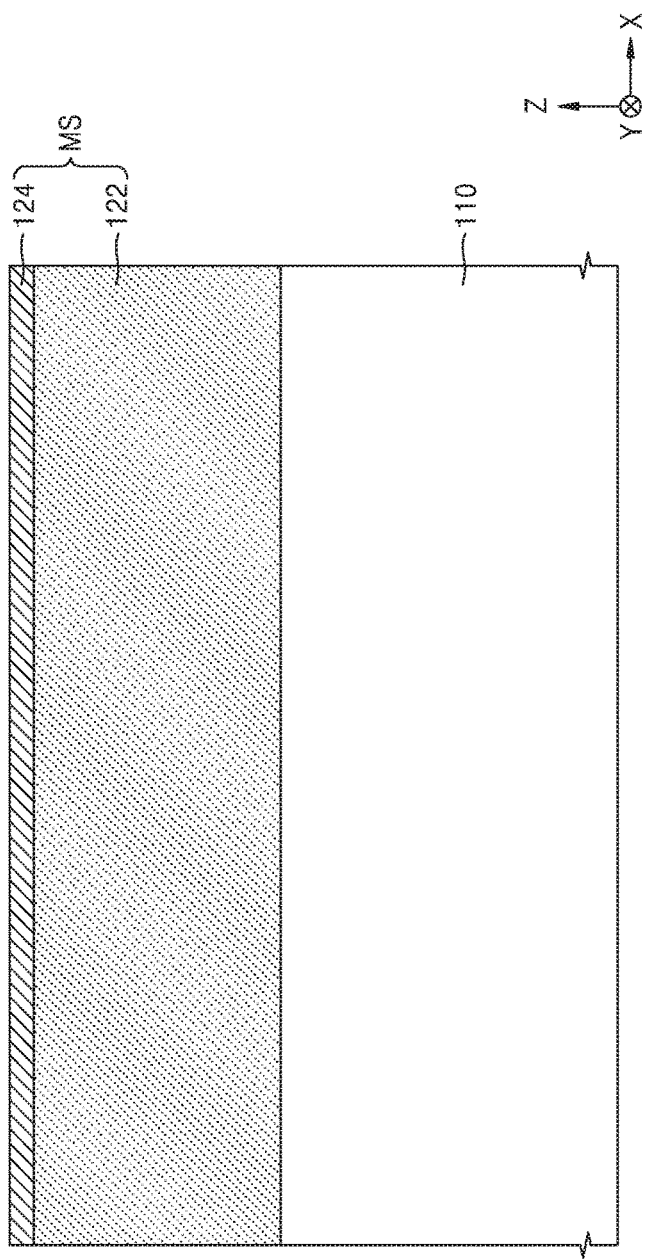

Referring to FIGS. 1 and 2A, in process P12, a stacked mask structure MS including a carbon-containing film 122 and a silicon-containing organic anti-reflective film 124 is formed on a substrate 110. Here, the term "organic" as will be understood by those skilled in the art refers to organic compounds as traditionally defined.

The substrate 110 may include a semiconductor substrate. In some examples, the substrate 110 includes a semiconductor, such as silicon (Si) or germanium (Ge). In some examples, the substrate 110 includes a compound semiconductor, such as SiGe, SiC, GaAs, InAs, or InP. In some examples, the substrate 110 has a silicon-on-insulator (SOI) structure. The substrate 110 may include a conductive region, for example, a well doped with an impurity, or a structure doped with an impurity. In some examples, the substrate 110 has various device isolation structures, such as a shallow trench isolation (STI) structure.

The carbon-containing film 122 may include a spin-on hardmask (SOH) film or an amorphous carbon layer (ACL). The SOH film may include an organic compound having a relatively high carbon content of about 85 wt % to about 99 wt % based on the total weight of the organic compound. The organic compound may include a hydrocarbon compound having an aromatic ring, such as phenyl, benzene, or naphthalene, or a derivative of the hydrocarbon compound. Moreover, here and throughout the description that follows, any description of a characteristic of a compound or process parameter for forming an element in terms of a numerical value preceded by the term "about" is intended to encompass the numerical value and slight variations only from the numerical value as the result of inherent characteristics of a process used to form the compound or element. Thus, for example, the above description of the organic compound as having a relatively high carbon content of about 85 wt % to about 99 wt % will encompasses compounds whose carbon content is 85 wt % to 99 wt %, as well as compounds whose carbon content is slightly less than 85 wt % and compounds whose carbon content is slightly greater than 99 wt % as a result of variations inherent in a typical process specified to provide a particular carbon content of 85 wt % or 99 wt % or close thereto.

The carbon-containing film 122 may be formed by using a spin coating process or a chemical vapor deposition (CVD) process. In some examples, to form the carbon-containing film 122, an organic compound layer is formed on the substrate 110 by a spin-coating process. The organic compound layer may include a hydrocarbon compound having an aromatic ring, such as phenyl, benzene, or naphthalene, or a derivative of the hydrocarbon compound. The organic compound layer may have a relatively high carbon content of about 85 wt % to 99 wt % based on the total weight of the organic compound layer. The organic compound layer is cured by first-baking for about 60 seconds at a temperature of about 150° C. to about 350° C., and then, second-baking for about 30 seconds to about 300 seconds at a temperature of about 300° C. to about 550° C., thereby forming the carbon-containing film 122. The carbon-containing film 122 may have a thickness of about 400 nm to about 800 nm.

The silicon-containing organic anti-reflective film 124 may include a cross-linked polymer having a silicon content of about 10 wt % to about 50 wt %. The silicon-containing organic anti-reflective film 124 may be a commercially available product (e.g., Sepr-Shb Aseries SiARC manufactured by Shin Etsu Chemical Co., Ltd.). The silicon-containing organic anti-reflective film 124 may have a thickness of about 50 nm to about 100 nm. In some examples, the thickness of the carbon-containing film 122 of the stacked mask structure MS is about 5 to 10 times the thickness of the silicon-containing organic anti-reflective film 124.

Referring to FIGS. 1 and 2B, in process P14, a photoresist pattern PR is formed on the stacked mask structure MS (see FIG. 2A), and the silicon-containing organic anti-reflective film 124 is etched by using the photoresist pattern PR as an etch mask, thereby forming a silicon-containing organic anti-reflective pattern 124P.

In some examples, the photoresist pattern PR includes a positive photoresist. For example, the photoresist pattern PR may include a chemically amplified photoresist that includes a resin having an acid-labile group and a photo-acid generator (PAG). In an exposure process for forming the photoresist pattern PR, the exposure wavelength of i-line (365 nm), KrF excimer laser (248 nm), ArF excimer laser (193 nm), or $F_2$ excimer laser (157 nm) may be used. In some examples, when the exposure wavelength of 193 nm is used, an immersion lithography process is used.

To form the silicon-containing organic anti-reflective pattern 124P, a process gas containing a $C_xF_yH_z$ containing gas (where x and y are each an integer of 1 to 10 and z is an integer of 0 to 10) may be used to etch the silicon-containing organic anti-reflective film 124. Thus, the $C_xF_yH_z$ containing gas may be a gas containing carbon (C) and fluorine (F), or a gas containing C, F, and hydrogen (H). For example, the process gas may include $CF_4$, $C_3F_6$, $C_4F_6$, $C_4F_8$, $C_5F_8$, $CHF_3$, $CH_2F_2$, or a combination thereof. In some examples, the process gas further includes an inert gas, such as argon (Ar).

Referring to FIGS. 1 and 2C, in process P16, the carbon-containing film 122 is etched by using the silicon-containing organic anti-reflective pattern 124P as an etch mask to form a composite mask (referred to hereinafter as composite mask pattern 122X) including a carbon-containing mask pattern 122P and a profile control liner 122Q covering sides surfaces of the carbon-containing mask pattern 122P that define openings therethrough that expose select portions of the underlying structure, e.g., the substrate 110.

In some examples, the photoresist pattern PR (see FIG. 2B) on the silicon-containing organic anti-reflective pattern 124P is consumed due to an etching atmosphere in the process chamber during the process P16 of etching of the carbon-containing film 122. In some examples, prior to the process P16, the photoresist pattern PR on the silicon-containing organic anti-reflective pattern 124P is removed to expose a top surface of the silicon-containing organic anti-reflective pattern 124P.

In order to form the composite mask pattern 122X, the carbon-containing film 122 may be plasma-etched by an etch gas consisting of or including sulfur-containing gas. The sulfur-containing gas may be COS, $CS_2$, $SO_2$, or a combination thereof. In some examples, the etch gas for plasma-etching the carbon-containing film 122 includes, in addition to sulfur-containing gas, at least one component selected from $O_2$, $CO_2$, $H_2$, and an inert gas. For example, the etch gas for plasma-etching the carbon-containing film 122 may include sulfur-containing gas and $O_2$.

During the phase of the process in which the carbon-containing film 122 is plasma-etched to form the carbon-containing mask pattern 122P, sulfur or sulfur-containing byproducts derived from the sulfur-containing gas may be adsorbed or chemically bonded to exposed side walls of the carbon-containing mask pattern 122P to form the profile control liner 122Q including sulfur. Thus, by obtaining the composite mask pattern 122X in which the side wall surfaces of the carbon-containing mask pattern 122P, that delimit the openings therethrough, are protected by the profile control liner 122Q, the carbon-containing mask pattern 122P obtained during or after the etching of the carbon-containing film 122 may not experience a physical deformation, such as thinning, undercut, bowing, or lifting. In addition, after the composite mask pattern 122X is formed, the profile control liner 122Q may provide inner side wall surfaces defining a plurality of spaces S1 in the composite mask pattern 122X. Theses surfaces and hence, the side of each of the spaces S1 defined by the profile control liner 122Q, may extend substantially perpendicular to a main surface 110M of the substrate 110. By processing the substrate 110 using the composite mask pattern 122X having such a vertical side wall profile, the processing accuracy in the substrate 110 may be strictly controlled to a very fine level on the order of several nm.

The sulfur-containing gas of the etch gas for plasma-etching the carbon-containing film 122 may be included in an amount of about 35 vol % to about 50 vol % based on the total volume of the etch gas. For example, when the etch gas for plasma-etching the carbon-containing film 122 includes a sulfur-containing gas and $O_2$, a flow rate of the $O_2$ may be the same or greater than the flow rate of the sulfur-containing gas during the plasma-etching of the carbon-containing film 122. In some examples, when the etch gas for plasma-etching the carbon-containing film 122 includes COS and an $O_2$, the ratio of the flow rate of the COS to the flow rate of the $O_2$ is between about 1:1 and about 1:2. For example, the carbon-containing film 122 may be plasma-etched by an etch gas including COS supplied at a flow rate of about 40 sccm and $O_2$ supplied at a flow rate of about 60 sccm.

During the plasma-etching of the carbon-containing film 122, if the flow rate of the sulfur-containing gas were too low, sulfur or sulfur-containing byproducts derived from the sulfur-containing gas during the plasma-etching of the carbon-containing film 122 are not provided in a sufficient amount to the exposed side wall surfaces of the carbon-containing mask pattern 122P, and thus, the profile control liner 122Q may not have a desired (side-wall) profile. For example, when the etch gas for plasma-etching the carbon-containing film 122 contains sulfur-containing gas and $O_2$ and the flow rate of $O_2$ gas exceeds twice the flow rate of the sulfur-containing gas, it is likely that at least a portion of the side wall surfaces of the carbon-containing mask pattern 122P will not be covered by the profile control liner 122Q. In this case, the portion of the side wall surfaces that is not covered by the profile control liner 122Q may allow the carbon-containing mask pattern 122P to be consumed or subjected to a physical deformation, e.g., bowing, and thus, the composite mask pattern 122X including the carbon-containing mask pattern 122P may not have a desired vertical (side-wall) profile.

When the etch gas for plasma-etching the carbon-containing film 122 contains sulfur-containing gas and $O_2$ and the flow rate of the sulfur-containing gas is greater than the flow rate of the $O_2$, excess etch byproducts may be generated during the plasma-etching of the carbon-containing film 122, and thus, the etch speed of the carbon-containing film 122 may be too low, or the etching may terminate before the thickness of the carbon-containing film 122 being etched reaches a target etch level.

In some examples, the composite mask pattern 122X has a width of at least 100 nm in a horizontal direction, for example, an X direction and/or a Y direction. In some examples, the ratio of the height to the width, that is, the aspect ratio of the composite mask pattern 122X is at least 4, e.g., from about 4 to about 10, but the aspect ratio is not limited thereto.

Referring to FIGS. 1 and 2D, in process P18, ions 130 constituting an impurity (referred to hereinafter as impurity ions) may be implanted into the substrate 110 through the spaces S1 defined by the composite mask pattern 122X to form a plurality of wells 112 in the substrate 110. The wells 112 may each include an impurity region containing the impurity ions 130.

The impurity ions 130 may be an n-type dopant or a p-type dopant. When the substrate 110 includes a Group IV semiconductor such as Si, the n-type dopant may include a Group V element, such as phosphorus (P), arsenic (As) or antimony (Sb), and the p-type dopant may include a Group III element, such as boron (B). However, the inventive concept is not limited to these examples as the type of impurity ions 130 can vary depending on the material constituting the substrate 110.

Because the composite mask pattern 122X, having a (side wall) profile that extends substantially vertically, is used as the ion implantation mask during implantation of the impurity ions 130 into the substrate 110, the location of each of the wells 112 in the substrate 110 may be strictly controlled.

Figure 2E:
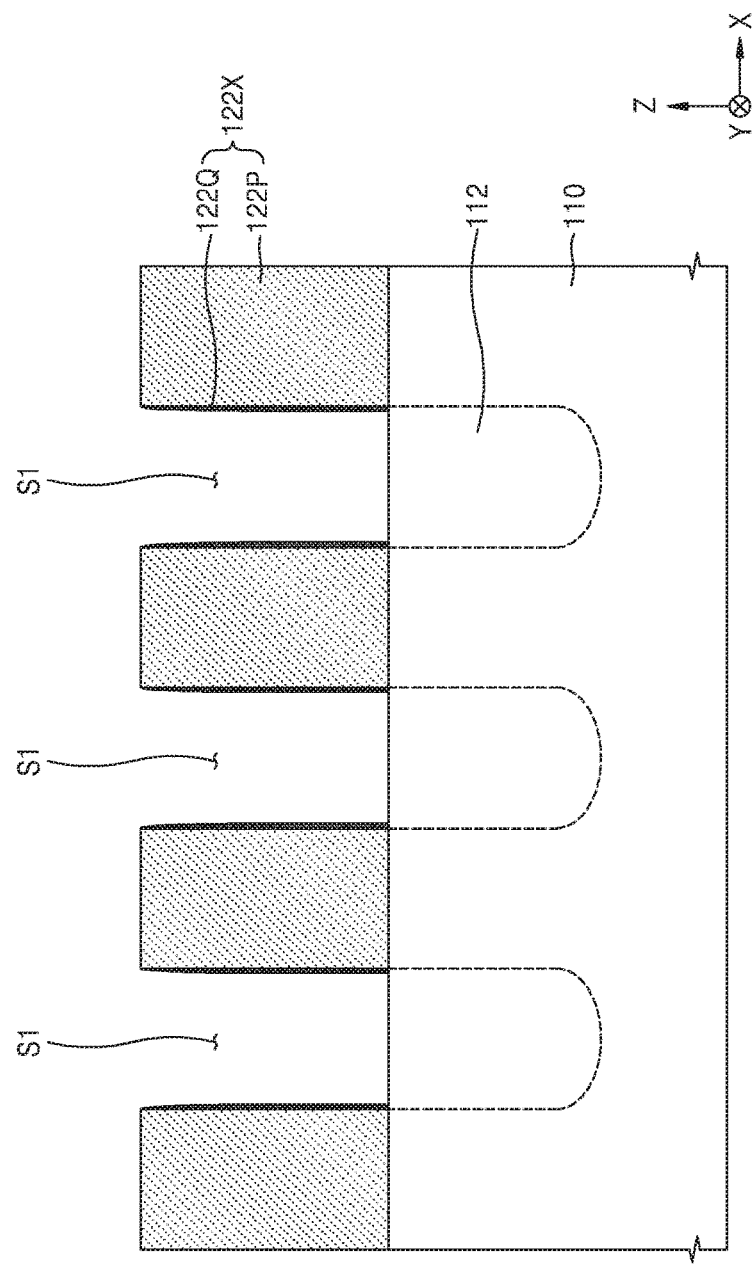

Referring to FIGS. 1 and 2E, in process P20, the silicon-containing organic anti-reflective pattern 124P is removed from the resultant structure shown in and described with reference to FIG. 2D.

A wet etching process using a first etchant may be performed to remove the silicon-containing organic anti-reflective pattern 124P. The first etchant may include $H_2SO_4$. For example, the first etchant may be a mixture including $H_2SO_4$, $H_2O_2$, and deionized water (DIW). In some examples, $H_2SO_4$ (purity 98%) and $H_2O_2$ (purity 30%) in the first etchant are included at a volume ratio of about 4:1, but the volume ratio is not limited thereto.

Figure 2F:
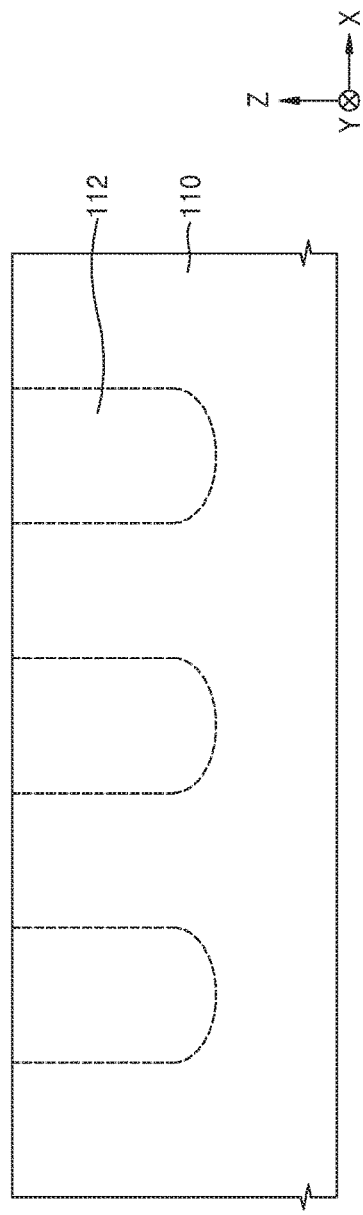

Referring to FIGS. 1 and 2F, in process P22, the composite mask pattern 122X is removed from the resultant structure shown in and described with reference to FIG. 2E.

A wet etching process using a second etchant having a composition that is different from that of the first etchant may be performed to remove the composite mask pattern 122X. The second etchant may be a mixture including $NH_4OH$, $H_2O_2$, and DIW. In some examples, $NH_4OH$ (purity 28%), $H_2O_2$ (purity 30%), and DIW in the second etchant are included at a volume ratio of about 1:1:5, but the volume ratio is not limited thereto.

According to a method of manufacturing an integrated circuit device as described with reference to FIGS. 1 and 2A to 2F, when performing the ion implantation process for forming the wells 112 required to have a very fine critical dimension (CD) due to the down-scaling, the composite mask pattern 122X providing a side wall profile that extends substantially vertically is used as an ion implantation mask. Therefore, the location and dimensional accuracy of the wells 112 may be precisely controlled.

Figure 3A:
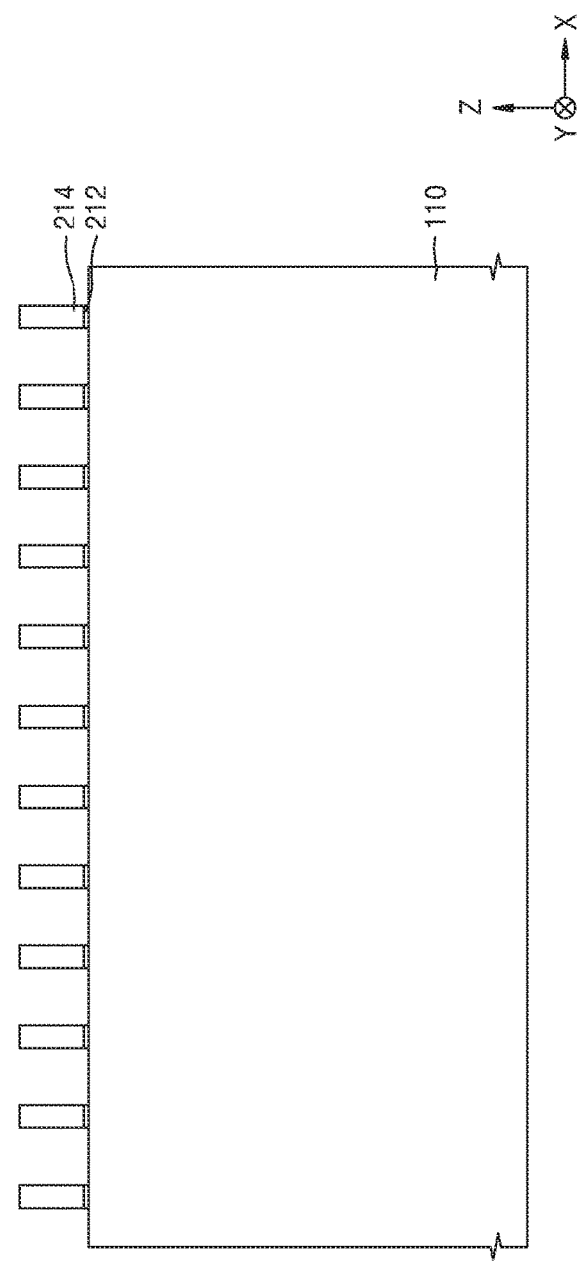
Figure 3B:
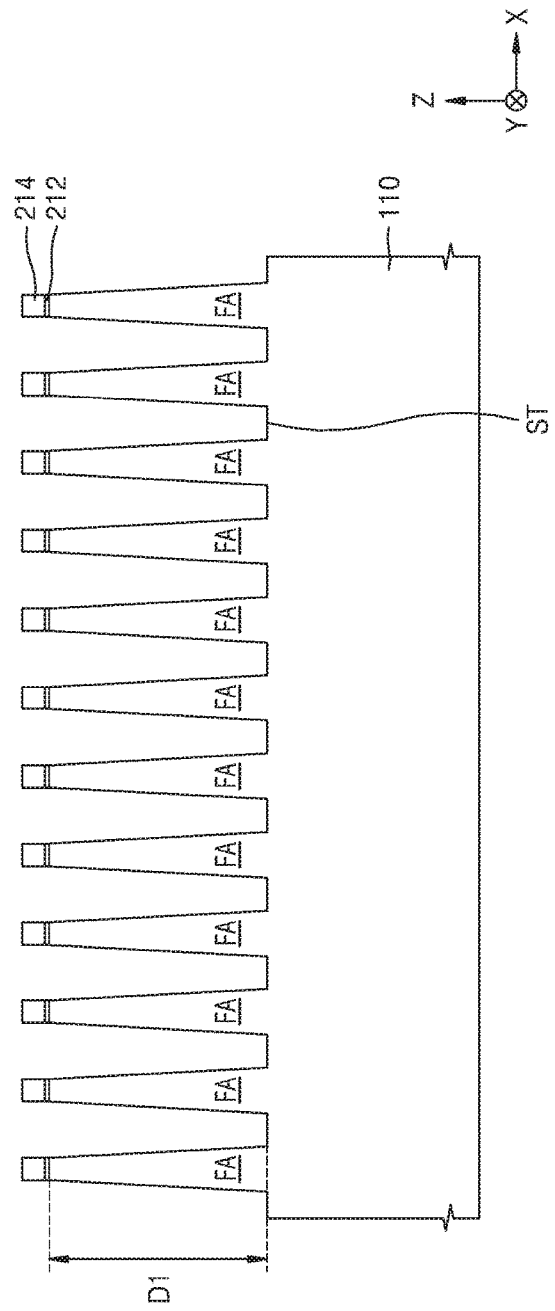
Figure 3C:
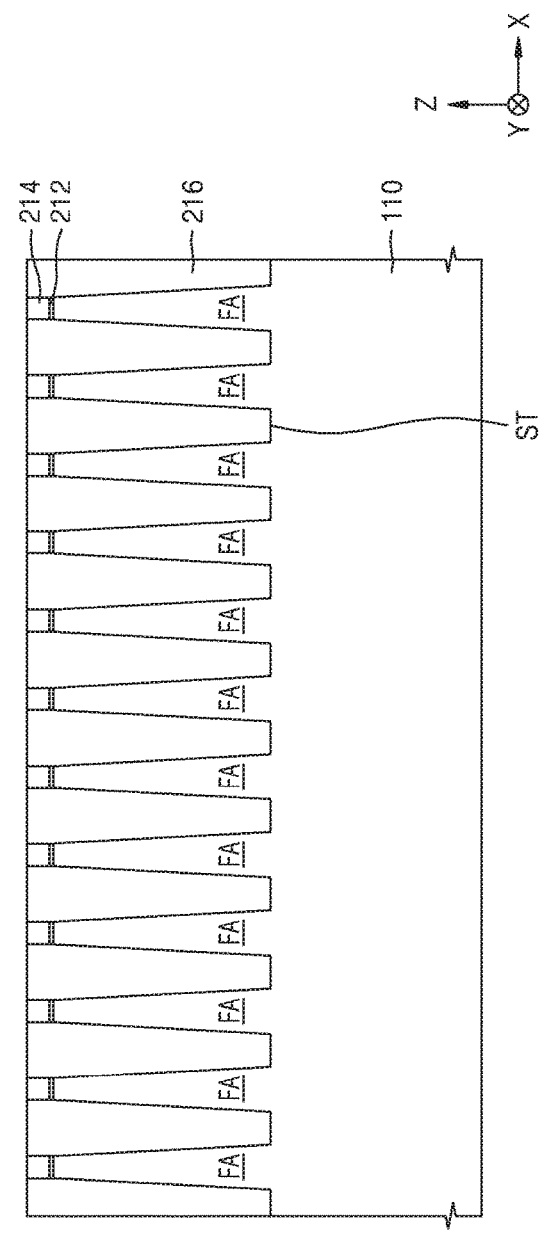
Figure 3E:
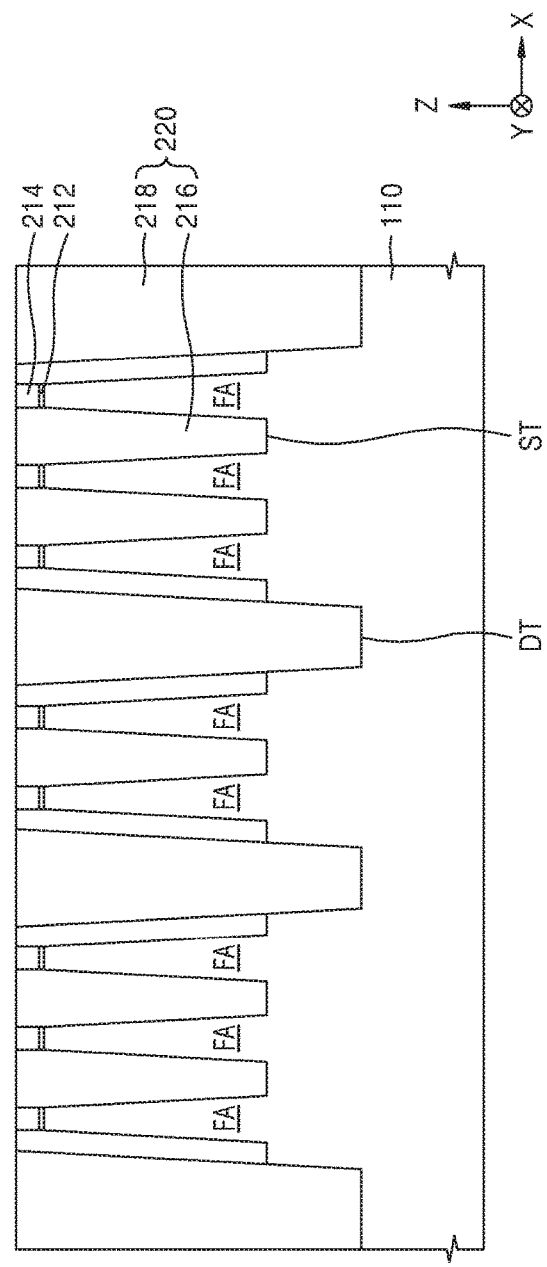
Figure 3G:
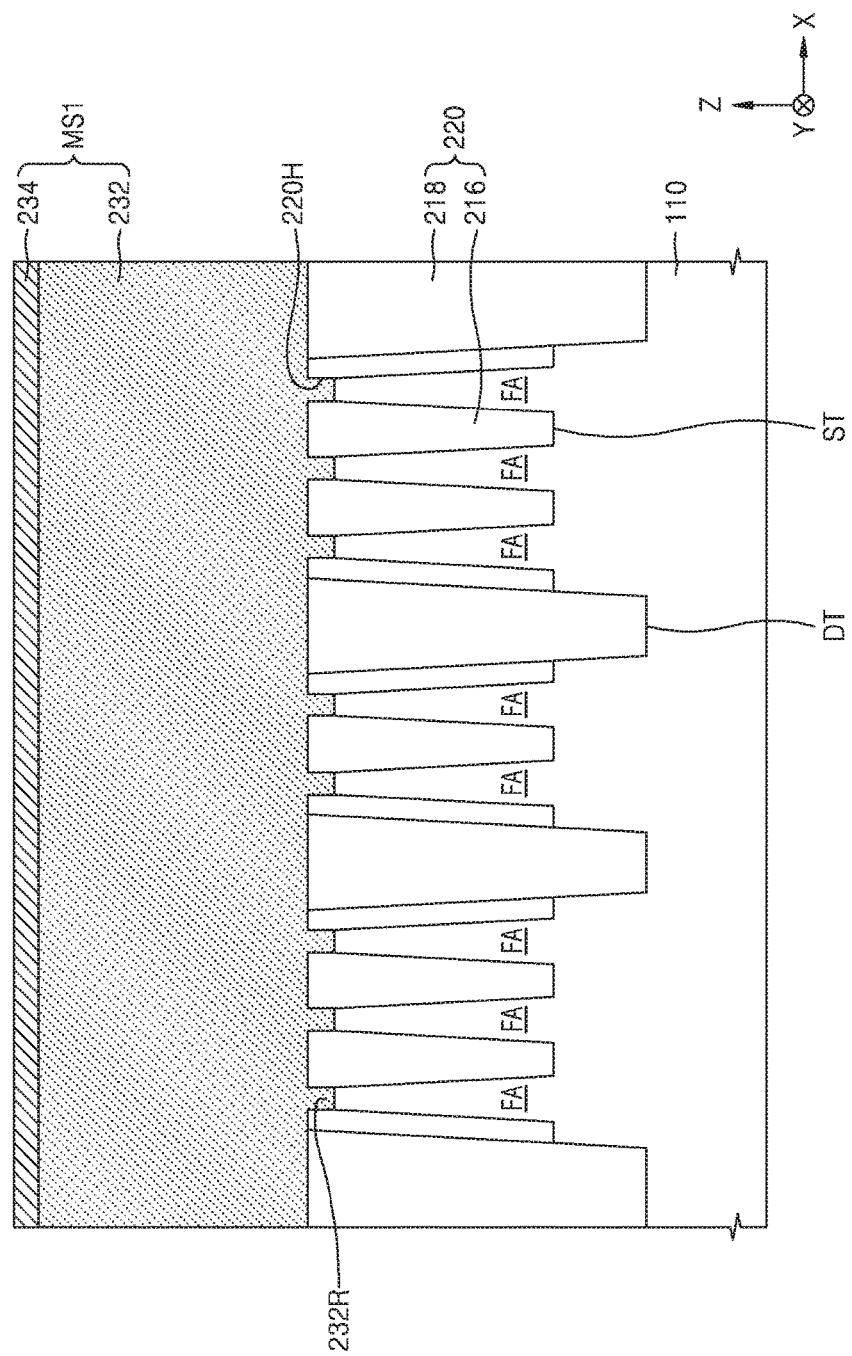
Figure 3H:
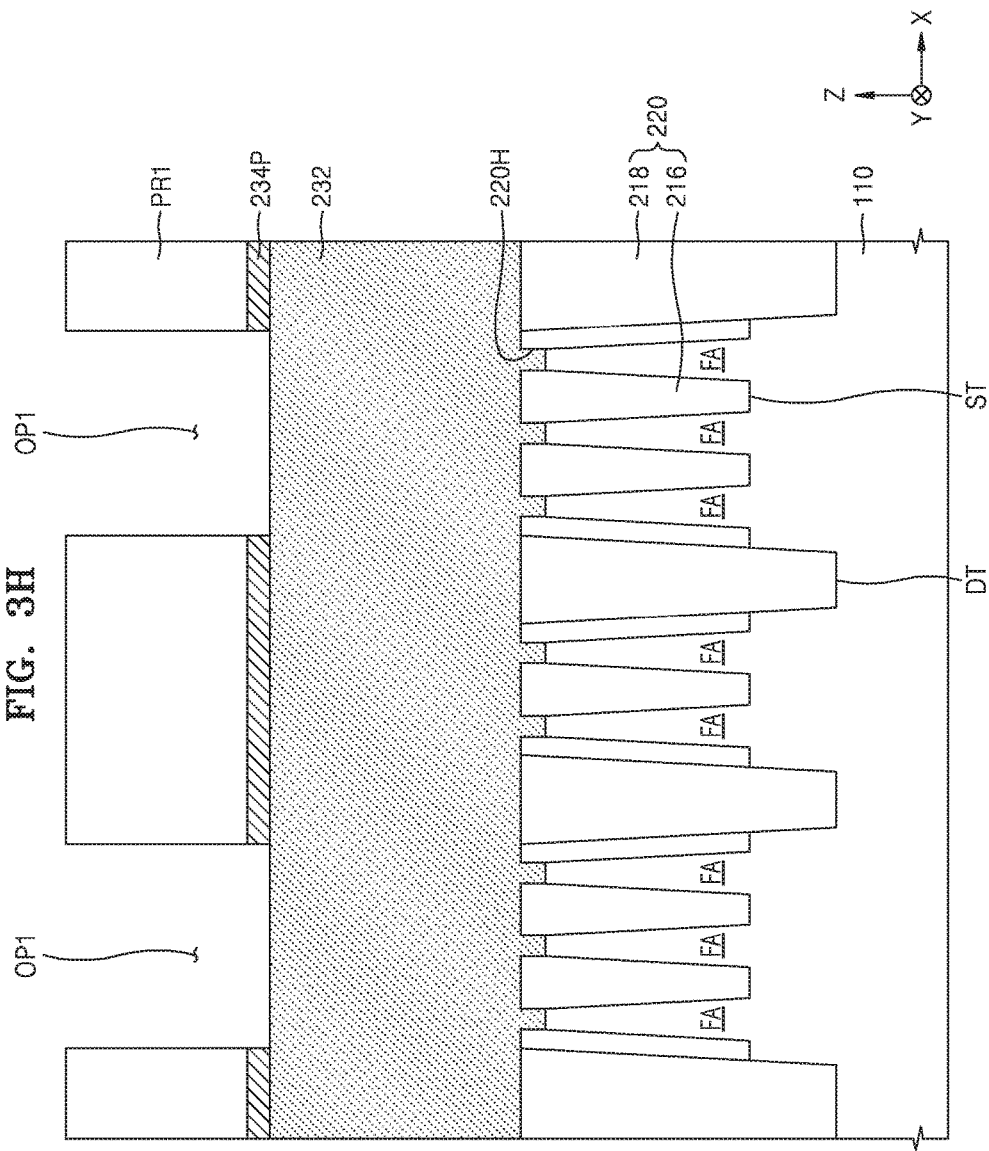
Figure 31:
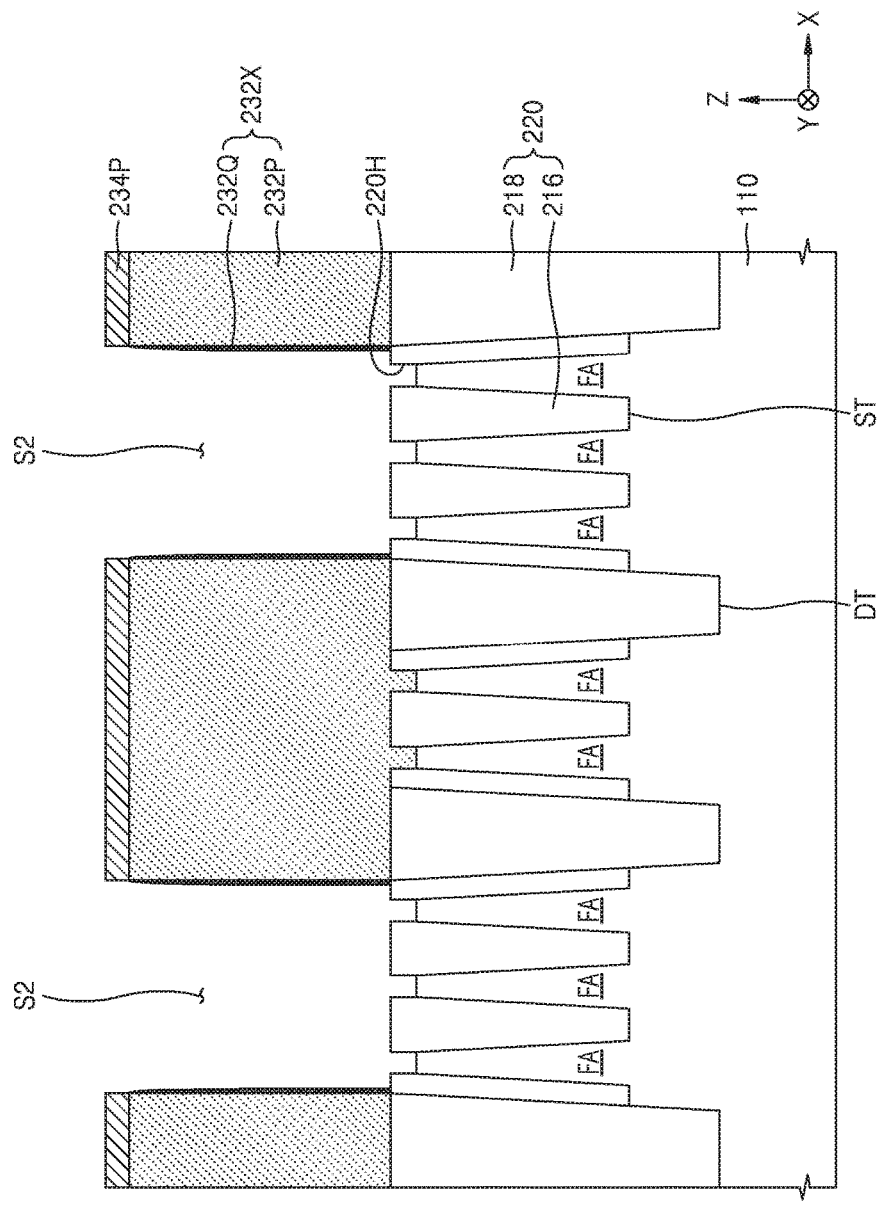
Figure 3J:
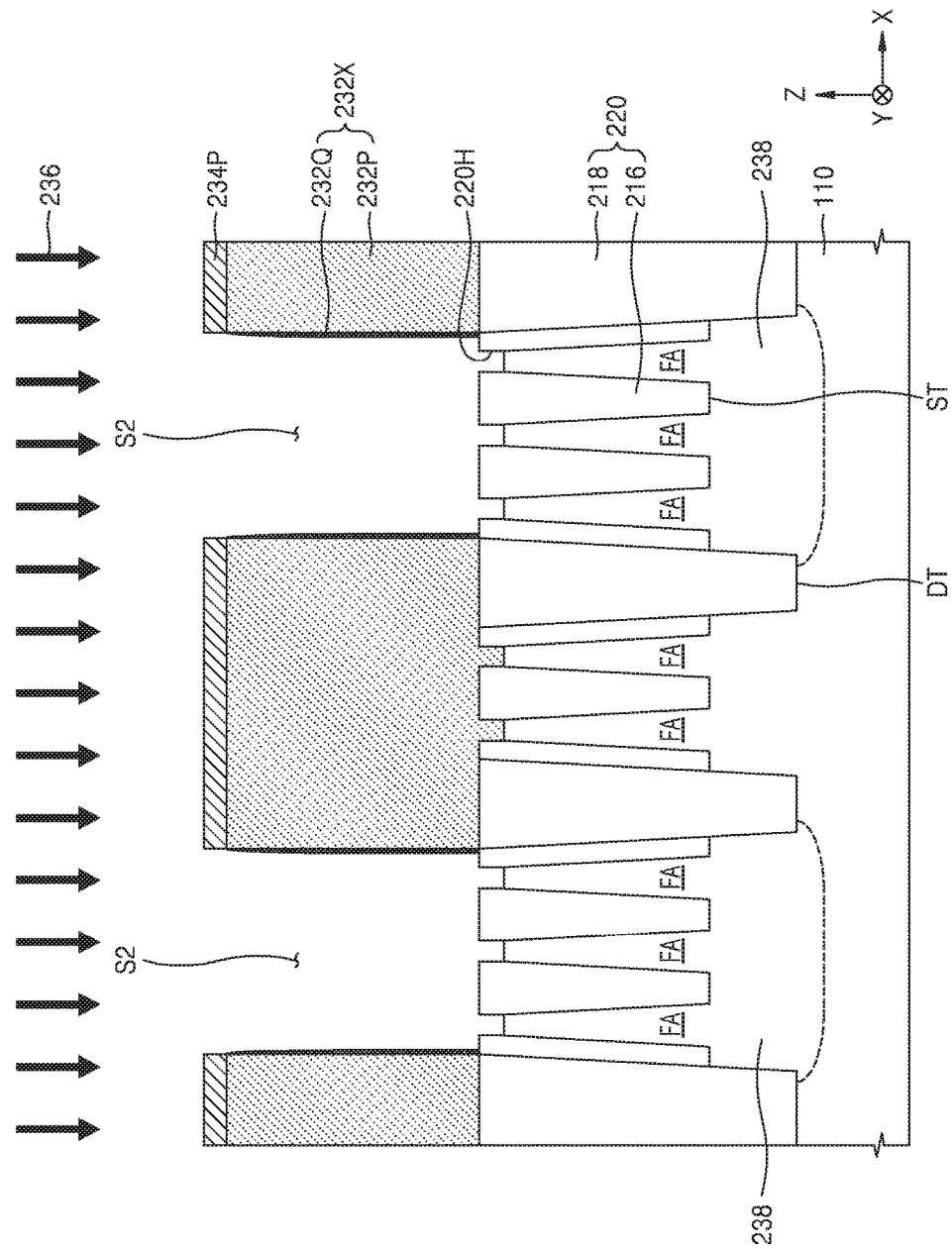
Figure 3K:
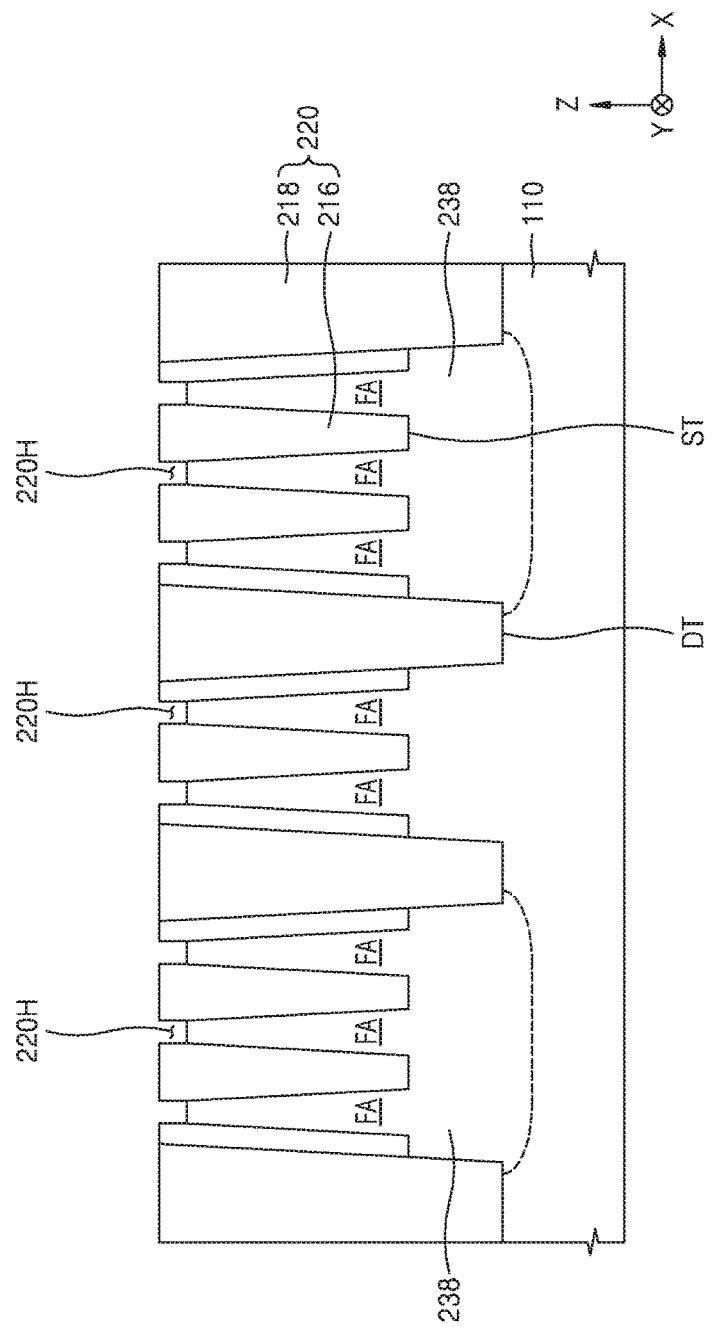
Figure 30:
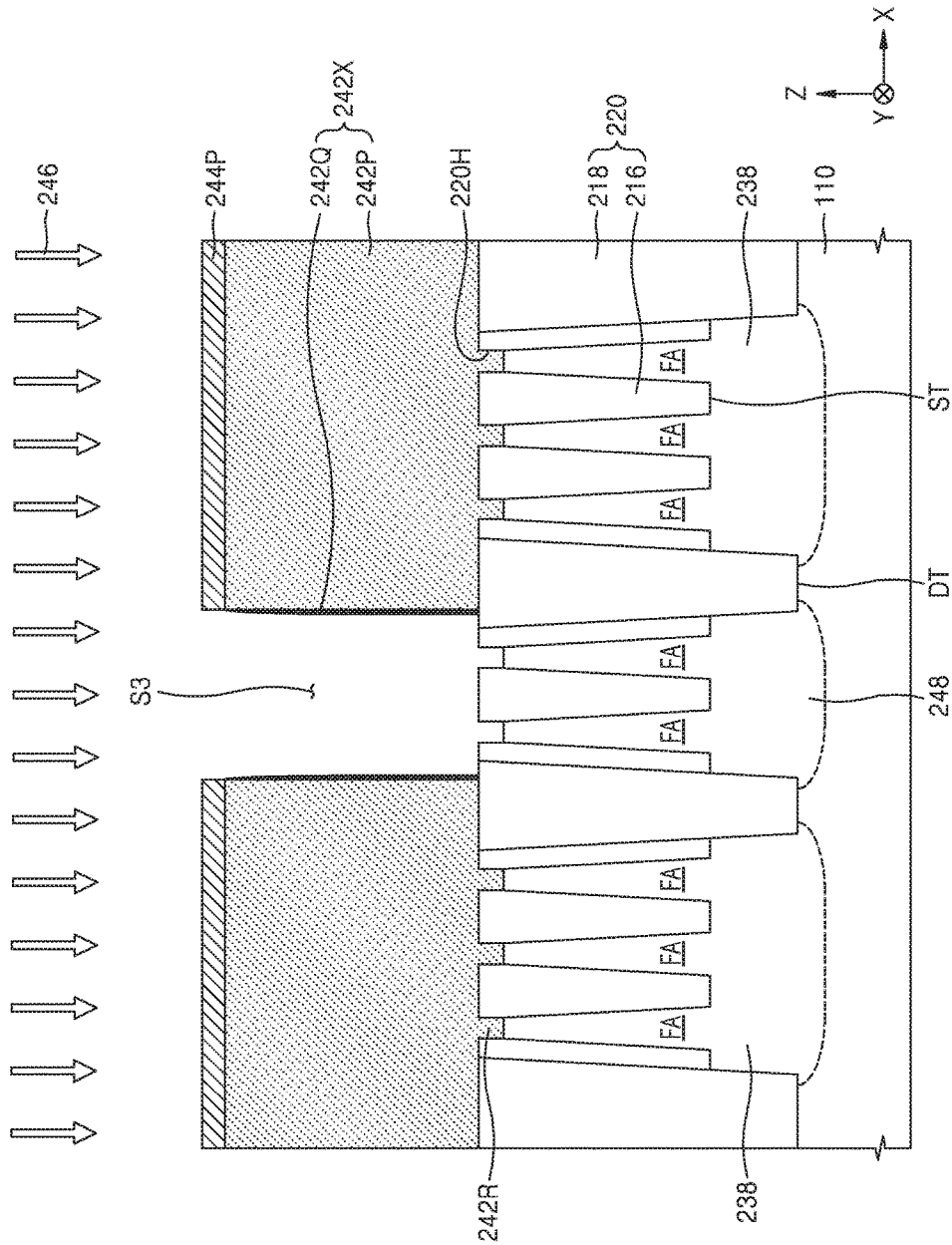
Figure 3P:
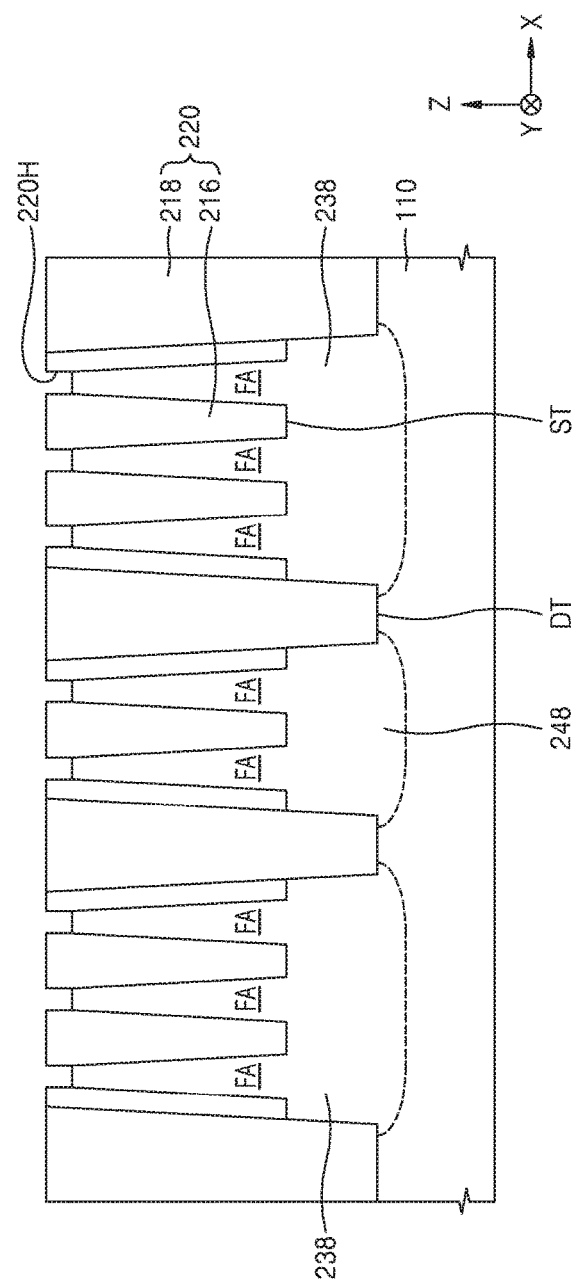
Figure 3Q:
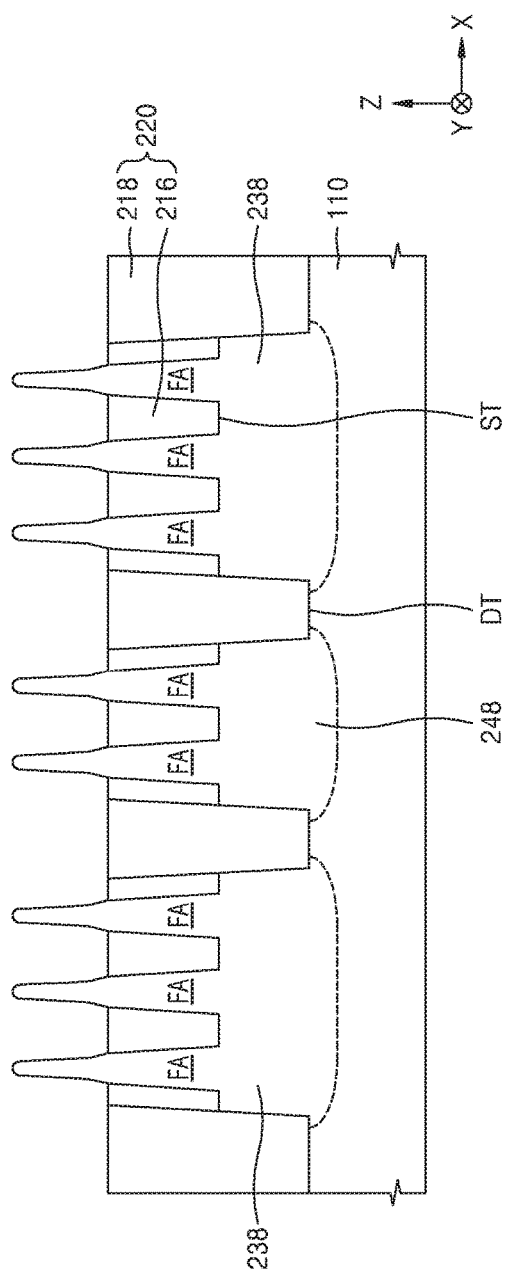
Figure 3R:
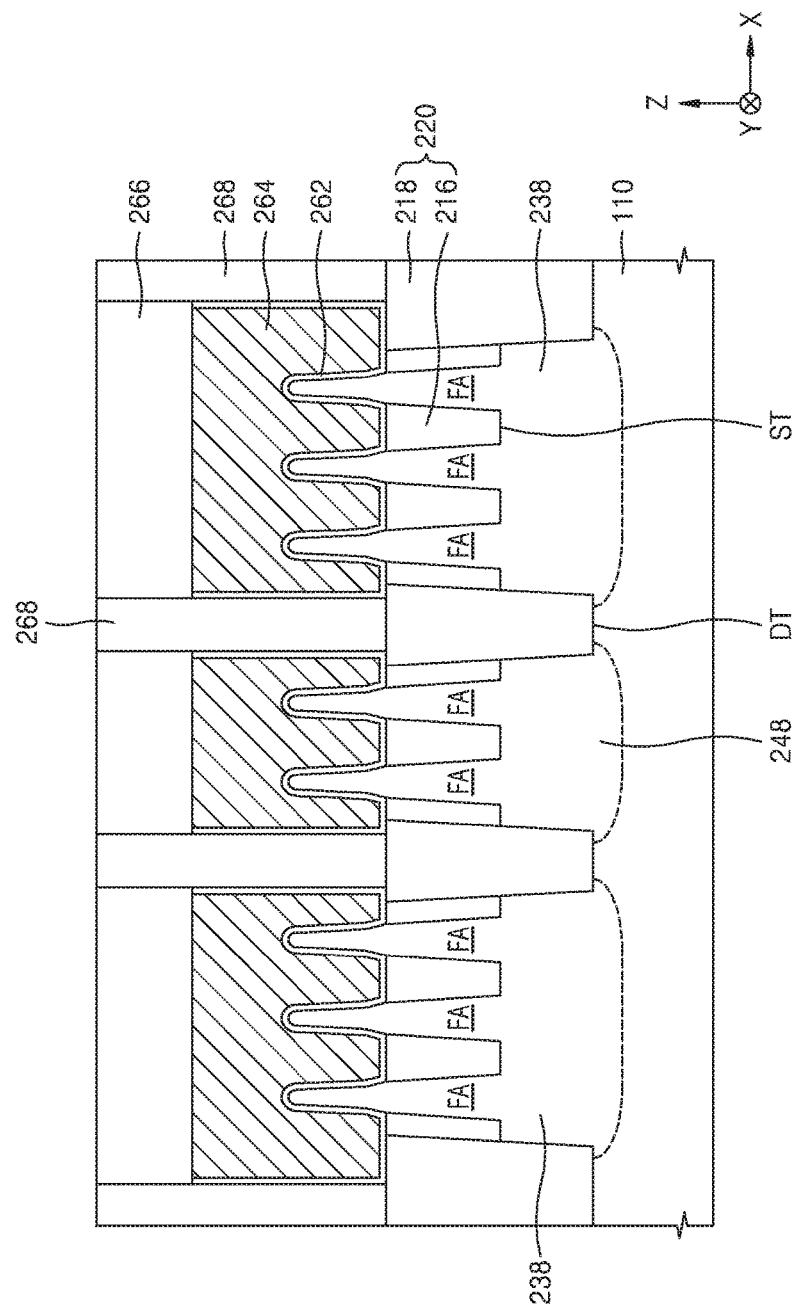

FIGS. 3A to 3R illustrate other examples of a method of manufacturing an integrated circuit device according to the inventive concept. Like reference numerals in FIGS. 3A to 3R and FIGS. 2A to 2F denote like elements, which will not be described again in detail for the sake of brevity.

Referring to FIG. 3A, a plurality of pad oxide film patterns 212 and a plurality of mask patterns 214 are formed on a substrate 110.

Each of the pad oxide film patterns 212 and the mask patterns 214 may be elongated in and extend parallel to each other in a direction (Y direction) on the substrate 110. In some examples, the pad oxide film patterns 212 may include an oxide film obtained by thermally oxidizing the surface of the substrate 110. The mask patterns 214 may each include a silicon nitride film, a silicon oxynitride film, a spin on glass (SOG) film, a photoresist film, or a combination thereof, but the inventive concept is not limited thereto.

Referring to FIG. 3B, a portion of the substrate 110 is etched by using the mask patterns 214 as an etch mask, thereby forming a plurality of shallow trenches ST. Due to the forming of the shallow trenches ST, a plurality of fin-type active areas FA that project upward from the substrate 110 in a vertical direction (Z direction) and that extend longitudinally in a horizontal direction (Y direction) are obtained. Each of the shallow trenches ST may have a depth D1 (as taken between the bottoms of the shallow trenches ST and the top surfaces of the fin-type active areas FA).

Referring to FIG. 3C, a first isolation insulating film 216 filling each of the shallow trenches ST in between the fin-type active areas FA may be formed.

In some examples, the first isolation insulating film 216 includes an insulating liner, a stressor liner, and a buried insulating film that sequentially cover side walls of each of the fin-type active areas FA. The insulating liner may be obtained by oxidizing the surfaces of the fin-type active areas FA. For example, the insulating liner may include a silicon oxide film formed by using a thermal oxidation process. The insulating liner may have a thickness of about 10 Å to about 100 Å. The stressor liner may conformally cover the insulating liner and may have a uniform thickness. The stressor liner may include SiN, SiON, SiBN, SiC, SiC:H, SiCN, SiCN:H, SiOCN, SiOCN:H, SiOC, $SiO_2$, polysilicon, or a combination thereof. The stressor liner may have a thickness of about 10 Å to about 100 Å. The stressor liner may be formed by plasma enhanced chemical vapor deposition (PECVD), high density plasma CVD (HDP CVD), inductively coupled plasma CVD (ICP CVD), or capacitor coupled plasma CVD (CCP CVD). The buried insulating film may include fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or tonen silazene (TOSZ), but the inventive concept is not limited thereto. The buried insulating film may be formed in such a way that an oxide film filling the inside of each of the shallow trenches ST is formed, and then, the oxide film may be annealed. Subsequently, a top portion of the oxide film may be removed to expose a top surface of each of the mask patterns 214. The buried insulating film may be formed by flowable chemical vapor deposition (FCVD) or spin coating.

The top surface of each of the mask patterns 214 and the top surface of the first isolation insulating film 216 may constitute a planarized surface. In some examples, the top surface of each of the mask patterns 214 and the top surface of the first isolation insulating film 216 are coplanar.

Referring to FIG. 3D, some of the fin-type active areas FA and their surrounding films are removed to form a plurality of deep trenches DT in the substrate 110.

Each of the deep trenches DT may have a depth D2 (as taken between the bottoms of the deep trenches DT and the top surfaces of the fin-type active areas FA). For example, the depth D2 may be in the range of about 50 nm to about 150 nm, but is not limited thereto. The depth D2 of the deep trenches DT may be greater than the depth D1 of the shallow trenches ST.

In some examples, the substrate 110 is divided into a plurality of device areas defined by the deep trenches DT. The device areas may be required to have different threshold voltages. For example, some of the device areas may be NMOS transistor areas, and other device areas may be PMOS transistor areas.

To form the deep trenches DT, in the resultant structure shown in and described in connection with FIG. 3C a photoresist pattern exposing a portion of the resultant structure is formed, and the exposed portion is dry-etched by using the photoresist pattern as an etch mask.

Referring to FIG. 3E, a second isolation insulating film 218 filling each of the deep trenches DT is formed. The first isolation insulating film 216 and the second isolation insulating film 218 may constitute a device isolation film 220.

The second isolation insulating film 218 may be formed by using a coating process or a deposition process. In some examples, the second isolation insulating film 218 includes USG, but the inventive concept is not limited thereto. A portion of the second isolation insulating film 218 may contact the first isolation insulating film 216.

In some examples, to form the second isolation insulating film 218, an insulating film filling each of the deep trenches DT is formed, and then, a top surface of the insulating film is planarized to expose the mask patterns 214. In this regard, a portion of the mask patterns 214 and a portion of the first isolation insulating film 216 may be consumed, leading to smaller thicknesses of the mask patterns 214 and the first isolation insulating film 216.

After the second isolation insulating film 218 is formed, the top surface of each of the mask patterns 214, the top surface of the first isolation insulating film 216, and the top surface of the second isolation insulating film 218 may constitute a planarized surface. In some examples, the top surface of each of the mask patterns 214, the top surface of the first isolation insulating film 216, and the top surface of the second isolation insulating film 218 are coplanar.

Referring to FIG. 3F, the pad oxide film patterns 212 and the mask patterns 214 are removed from the resultant structure shown in and described in connection with FIG. 3E to expose top surfaces of the fin-type active areas FA.

The removing of the pad oxide film patterns 212 and the mask patterns 214 may lead to the forming of a plurality of holes 220H in the device isolation film 220, wherein the holes 220H expose top surfaces of the fin-type active areas FA. The holes 220H may be elongated in the longitudinal direction of each of the fin-type active areas FA, that is, the Y direction.

Referring to FIG. 3G, a first stacked mask structure MS1 including a carbon-containing film 232 and a silicon-containing organic anti-reflective film 234 is formed on the fin-type active areas FA and the device isolation film 220.

The carbon-containing film 232 may include an SOH film or an ACL. The silicon-containing organic anti-reflective film 234 may include a cross-linked polymer having a silicon content of about 10 wt % to about 50 wt %. The carbon-containing film 232 and the silicon-containing organic anti-reflective film 234 may be formed by using the same method used to form the carbon-containing film 122 and the silicon-containing organic anti-reflective film 124 in the process P12 explained in connection with FIG. 1 and FIG. 2A.

The carbon-containing film 232 may contact the upper surface of the device isolation film 220 and the top surfaces of the fin-type active areas FA. The carbon-containing film 232 may fill the holes 220H, and, accordingly, the carbon-containing film 232 may include a plurality of protrusions 232R contacting the upper surfaces of the fin-type active areas FA.

Referring to FIG. 3H, a photoresist pattern PR1 is formed on the first stacked mask structure MS1 (see FIG. 3G), and the silicon-containing organic anti-reflective film 234 is etched using the photoresist pattern PR1 as an etch mask, thereby forming a silicon-containing organic anti-reflective pattern 234P.

The photoresist pattern PR1 may have an opening OP1 exposing the carbon-containing film 232 on any one kind of the device areas of the substrate 110. In some examples, the opening OP1 of the photoresist pattern PR1 exposes portions of the carbon-containing film 232 covering an NMOS transistor area of the substrate 110. In some examples, the opening OP1 of the photoresist pattern PR1 exposes portions of the carbon-containing film 232 covering a PMOS transistor area of the substrate 110. The photoresist pattern PR1 is substantially the same as the photoresist pattern PR described in connection with FIG. 2B. A method for forming the silicon-containing organic anti-reflective pattern 234P is the same as that for forming the silicon-containing organic anti-reflective pattern 124P described in connection with FIG. 2B.

Referring to FIG. 3I, the carbon-containing film 232 is etched using the silicon-containing organic anti-reflective pattern 234P as an etch mask to form a composite mask pattern 232X including a carbon-containing mask pattern 232P and a profile control liner 232Q covering side walls of the carbon-containing mask pattern 232P.

The composite mask pattern 232X may be formed by the method used to form the composite mask pattern 122X in process P16 explained in connection with FIG. 1 and FIG. 2C. The photoresist pattern PR1 (see FIG. 3H) on the silicon-containing organic anti-reflective pattern 234P may be consumed and removed during the etching of the carbon-containing film 232. In some examples, the photoresist pattern PR1 on the silicon-containing organic anti-reflective pattern 234P is removed to expose a top surface of the silicon-containing organic anti-reflective pattern 234P, and then, the carbon-containing film 232 is etched to form a carbon-containing mask pattern 232P.

In some examples, the composite mask pattern 232X has a width of at least 100 nm in a horizontal direction(s), for example, an X direction and/or a Y direction. In some examples, the ratio of the height to the width, that is, the aspect ratio of the composite mask pattern 232X may be at least 4, and preferable from about 4 to about 10, but the aspect ratio is not limited thereto.

The composite mask pattern 232X may define a plurality of spaces S2 whose widths are limited by the profile control liner 232Q. The spaces S2 may expose top surfaces of some of the fin-type active areas FA and the top surface of the device isolation film 220.

Referring to FIG. 3J, an impurity (ions) 236 is implanted into the substrate 110 through the spaces S2 defined by the composite mask pattern 232X to form a plurality of first wells 238 in the substrate 110.

The ion implantation process for forming the first wells 238 is substantially similar to that of forming the wells 112 in the process P18 described in connection with FIG. 1 and FIG. 2D.

In some examples, the first wells 238 provide an active area of the NMOS transistor area. In this case, the impurity 236 is a p-type dopant, and the first wells 238 are each a p-type well, i.e., a well containing a p-type dopant. In some examples, the first wells 238 provide an active area of the PMOS transistor area. In this case, the impurity 236 is an n-type dopant, and the first wells 238 are each an n-type well, i.e., a well containing an n-type dopant.

Referring to FIG. 3K, the silicon-containing organic anti-reflective pattern 234P and the composite mask pattern 232X are removed from the structure illustrated in FIG. 3J.

The silicon-containing organic anti-reflective pattern 234P and the composite mask pattern 232X may be removed by a method substantially the same as that for removing the silicon-containing organic anti-reflective pattern 124P and the composite mask pattern 122X in process P20 and process P22 explained in connection with FIG. 1, and FIGS. 2E and 2F.

Once the silicon-containing organic anti-reflective pattern 234P and the composite mask pattern 232X are removed, the top surface of the device isolation film 220 and the top surface of each of the fin-type active areas FA on the substrate 110 may be exposed again.

Referring to FIG. 3I, a second stacked mask structure MS2 including a carbon-containing film 242 and a silicon-containing organic anti-reflective film 244 is formed on the fin-type active areas FA and the device isolation film 220.

The carbon-containing film 242 and the silicon-containing organic anti-reflective film 244 may be formed by a method substantially the same as that used to form the carbon-containing film 122 and the silicon-containing organic anti-reflective film 124 in process P12 explained in connection with FIG. 1, and FIG. 2A. The carbon-containing film 242 may contact the upper surface of the device isolation film 220 and the top surfaces of the fin-type active areas FA. The carbon-containing film 242 may fill the holes 220H, and, accordingly, the carbon-containing film 242 may include a plurality of protrusions 242R contacting the upper surfaces of the fin-type active areas FA.

Referring to FIG. 3M, a photoresist pattern PR2 is formed on the second stacked mask structure MS2 (see FIG. 3I), and the silicon-containing organic anti-reflective film 244 is etched using the photoresist pattern PR2 as an etch mask, thereby forming a silicon-containing organic anti-reflective pattern 244P.

The photoresist pattern PR2 may have an opening OP2. In some examples, when the first wells 238 formed in the substrate 110 provide the active area of the NMOS transistor area, portions of the carbon-containing film 242 covering the PMOS transistor area of the substrate 110 are exposed through the opening OP2. In some examples, when the first wells 238 formed in the substrate 110 provide the active area of the PMOS transistor area, portions of the carbon-containing film 242 covering the NMOS transistor area of the substrate 110 are exposed through the opening OP2. The photoresist pattern PR2 is substantially the same as the photoresist pattern PR described in connection with FIG. 2B. A method for forming the silicon-containing organic anti-reflective pattern 244P is substantially the same as that for forming the silicon-containing organic anti-reflective pattern 124P described in connection with FIG. 2B.

Referring to FIG. 3N, the carbon-containing film 242 (see FIG. 3M) is etched using the silicon-containing organic anti-reflective pattern 244P as an etch mask to form a composite mask pattern 242X including a carbon-containing mask pattern 242P and a profile control liner 242Q covering side walls of the carbon-containing mask pattern 242P.

The composite mask pattern 242X may be formed by a method substantially the same as that used to form the composite mask pattern 122X explained in connection with the process P16 of FIG. 1 and FIG. 2C. The photoresist pattern PR2 (see FIG. 3M) on the silicon-containing organic anti-reflective pattern 244P may be consumed and removed during the etching of the carbon-containing film 242. In some examples, the photoresist pattern PR2 on the silicon-containing organic anti-reflective pattern 244P is removed to expose a top surface of the silicon-containing organic anti-reflective pattern 244P, and then, the carbon-containing film 242 is etched to form a carbon-containing mask pattern 242P. The composite mask pattern 242X may define a plurality of spaces S3 whose widths are limited by the profile control liner 242Q. The spaces S3 may expose top surfaces of some of the fin-type active areas FA and the top surface of the device isolation film 220.

Referring to FIG. 3O, an impurity (ions) 246 is implanted into the substrate 110 through the spaces S3 defined by the composite mask pattern 242X to form a second well 248 in the substrate 110. According to the present example, there is one second well. However, in other examples, there are two or more second wells in the substrate 110.

The ion implantation process for forming the second well 248 is substantially similar to that described to form the wells 112 in process P18 explained in connection with FIG. 1, and FIG. 2D.

In some examples, when the first wells 238 each provide an active area of the NMOS transistor area, the second well 248 provides an active area of the PMOS transistor area. In this case, the impurity 236 may be an n-type dopant, and the second well 248 is an n-type well, i.e., a well containing an n-type dopant. In some examples, when the first wells 238 each provide an active area of the PMOS transistor area, the second well 248 provides an active area of the NMOS transistor area. In this case, the second well 248 is a p-type well, i.e., a well containing a p-type dopant.

Referring to FIG. 3P, the silicon-containing organic anti-reflective pattern 244P and the composite mask pattern 242X are removed from the structure illustrated in FIG. 3O.

The silicon-containing organic anti-reflective pattern 244P and the composite mask pattern 242X may be removed by a method substantially the same as that used to remove the silicon-containing organic anti-reflective pattern 124P and the composite mask pattern 122X described in connection with the process P20 and process P22 of FIG. 1, and FIGS. 2E and 2F.

Once the silicon-containing organic anti-reflective pattern 244P and the composite mask pattern 242X are removed, the top surface of the device isolation film 220 and the top surface of each of the fin-type active areas FA may be exposed again.

Referring to FIG. 3Q, a recess process is performed to remove a portion of the device isolation film 220 to expose a top portion of each of the fin-type active areas FA.

The recess process may be performed by a dry etching, a wet etching, or a combination of dry etching and wet etching. During the recess process, the top portion of each of the fin-type active areas FA is exposed to an etching environment and/or a cleaning environment after the etching. Accordingly, the top portion of each of the fin-type active areas FA may be partially consumed from its outer surface, thereby having a smaller width as illustrated in FIG. 3Q compared to that before the partial consumption thereof.

In some examples, an ion implantation process is performed to implant an impurity for threshold voltage adjustment on the top portion of each of the fin-type active areas FA exposed above the device isolation film 220. At this time, an ion implantation mask, having a configuration similar to the combination of the composite mask pattern 232X and the silicon-containing organic anti-reflective pattern 234P illustrated in FIG. 3J, is used to ion-implant the impurity for threshold voltage adjustment on the top portion of each of the fin-type active areas FA in the first wells 238. In one or more examples, an ion implantation mask, having a configuration similar to the combination of the composite mask pattern 242X and the silicon-containing organic anti-reflective pattern 244P illustrated in FIG. 3N, is used to ion-implant the impurity for threshold voltage adjustment on the top portion of each of the fin-type active areas FA in the second well 248. Regarding the first wells 238 and the second well 248, boron (B) ions are implanted as an impurity into an area where the NMOS transistor is formed, and phosphorous (P) ions, arsenic (As) ions, or antimony (Sb) ions are implanted as an impurity into an area where the PMOS transistor is formed.

Referring to FIG. 3R, source/drain areas (not shown) are formed on the fin-type active areas FA, and then, a plurality of gate dielectric layers 262, a plurality of gate lines 264, and a plurality of insulating capping films 266 may be formed on the fin-type active areas FA. A gate cut insulating film 268 may be formed between two neighboring ones of the gate lines 264. The gate cut insulating film 268 may be formed before the gate dielectric layers 262, the gate lines 264, and the insulating capping films 266 are formed.

The gate dielectric layers 262 may include a silicon oxide layer, a high-k dielectric layer, or a combination thereof. The high-k dielectric film is a film of material whose dielectric constant is greater than that of a silicon oxide film. The high-k dielectric film may include a metal oxide or a metal oxynitride. In some examples, an interface film (not shown) is located between the fin-type active areas FA and the gate dielectric layers 262. The interface film may include an oxide film, a nitride film, or an oxynitride film.

The gate lines 264 may have a structure in which a metal nitride film, a metal film, a conductive capping film, and a gap-fill metal film are sequentially stacked. The metal nitride film and the metal film may each include at least one metal selected from the group consisting of Ti, Ta, W, Ru, Nb, Mo, and Hf. The gap-fill metal film may include a W film or an Al film. The gate lines 264 may each include a work function metal-containing film. The work function metal-containing film may include at least one metal selected from the group consisting of Ti, W, Ru, Nb, Mo, Hf, Ni, Co, Pt, Yb, Tb, Dy, Er, and Pd. As examples, each of the gate lines 264 may have a stack structure of TiAlC/TiN/W, a stack structure of TiN/TaN/TiAlC/TiN/W, or a stack structure of TiN/TaN/TiN/TiAlC/TiN/W.

The insulating capping film 266 and the gate cut insulating film 268 may each include a nitride film, but the inventive concept is not limited thereto.

In some examples, a gate-last process (also referred to as a replacement poly-gate process) is used to form the gate dielectric layers 262, the gate lines 264, and the insulating capping films 266. However, the inventive concept is not limited thereto.

According to the method of manufacturing an integrated circuit device described with reference to FIGS. 3A to 3R, when the ion implantation process is performed to form the first wells 238 and the second well 248, each having a very fine CD, due to the use of the composite mask patterns 232X and 242X providing a vertical side wall profile, which extends substantially vertically, the location and dimensional accuracy of the first wells 238 and the second well 248 may be precisely controlled. Accordingly, the method facilitates the down-scaling of integrated circuits having wells formed by an ion implantation process.

Examples of methods of manufacturing an integrated circuit device according to the inventive concept have been described hereinabove with reference to FIGS. 1 to 3R. However, the inventive concept is not limited to these examples, and an integrated circuit device having various other structures may be manufactured within the scope of inventive concept. For example a method of manufacturing an integrated circuit device including a FinFET whose channel has a three-dimensional structure has been described with reference to FIGS. 3A to 3R. However, the inventive concept is not limited to the above example. Rather, the method of manufacturing an integrated circuit device according to the inventive concept may be similarly used to manufacture an integrated circuit device including a planar MOSFET, for example.

Figure 4A:
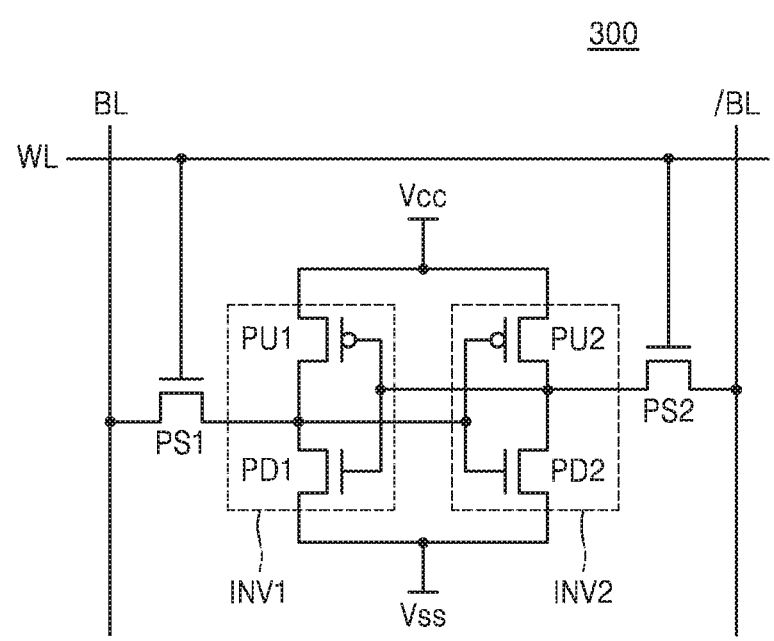
FIG. 4A is a circuit diagram of an example integrated circuit device that may be manufactured by a method of manufacturing an integrated circuit device according to the inventive concept.
Figure 4B:
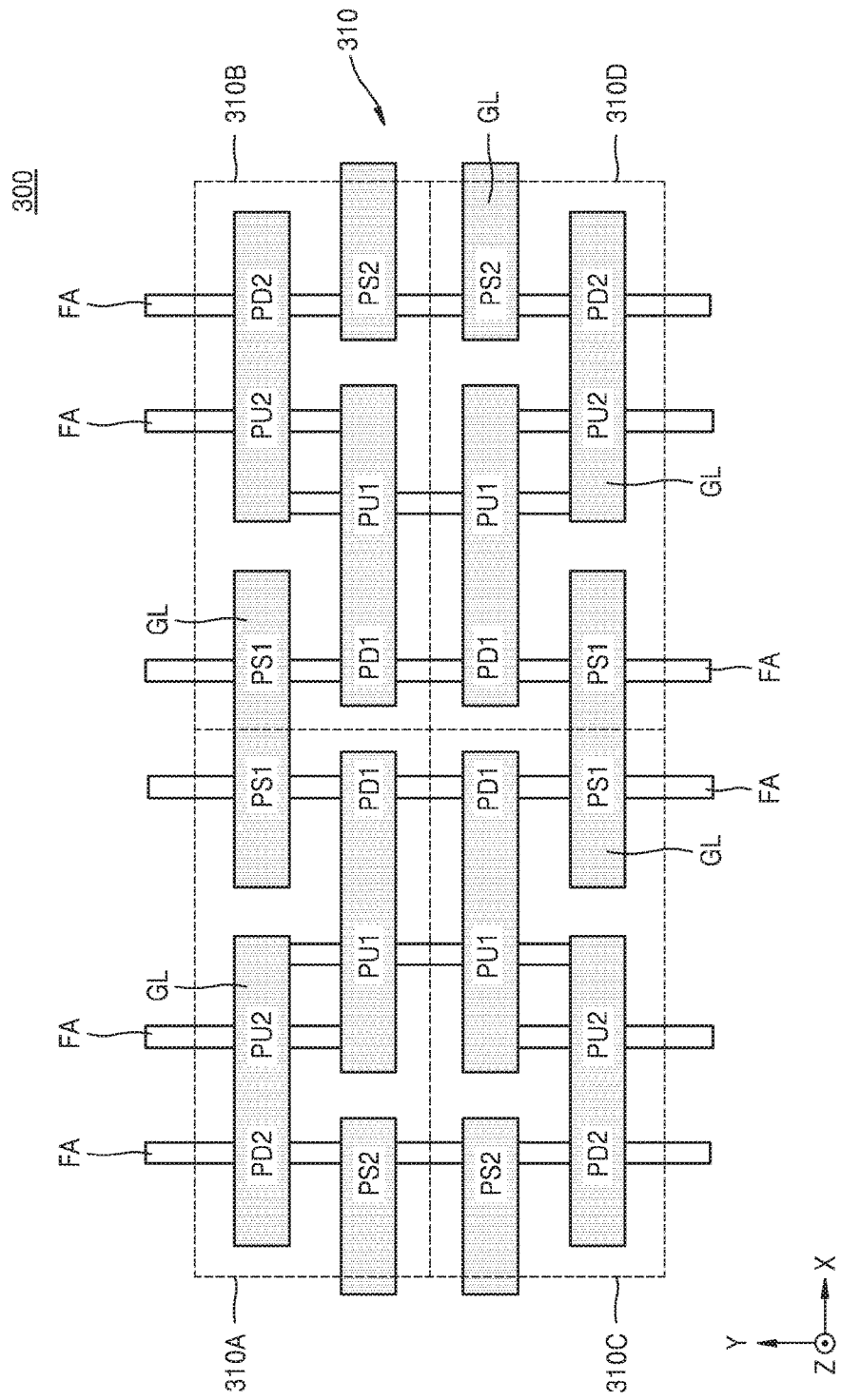
FIG. 4B is a plan view of main elements of an example integrated circuit device that may be manufactured by a method of manufacturing an integrated circuit device according to the inventive concept.

FIG. 4A shows a circuit diagram of an integrated circuit device 300 as an example that may be manufactured using a method of manufacturing an integrated circuit device according to the inventive concept. The circuit diagram shown in FIG. 4A is of a 6T SRAM cell including six transistors. FIG. 4B is a top view of the integrated circuit device 300 having circuitry corresponding to that illustrated in FIG. 4A.

Referring to FIG. 4A, the integrated circuit device 300 includes a pair of inverters INV1 and INV2 connected in parallel between a power supply node Vcc and a ground node Vss, and a first pass transistor PS1 connected to an output node of the inverter INV1 and a second pass transistor PS2 connected to an output node of the inverter INV2. The first pass transistor PS1 and the second pass transistor PS2 may be connected to a bit line BL and a complementary bit line /BL, respectively. A gate of the first pass transistor PS1 and a gate of the second pass transistor PS2 may each be connected to a word line WL.

The first inverter INV1 may include a first pull-up transistor PU1 and a first pull-down transistor PD1, which are connected in series, and a second inverter INV2 may include a second pull-up transistor PU2 and a second pull-down transistor PD2, which are connected in series. The first pull-up transistor PU1 and the second pull-up transistor PU2 may be PMOS transistors, and the first pull-down transistor PD1 and the second pull-down transistor PD2 may be NMOS transistors.

An input node of the first inverter INV1 is connected to an output node of the second inverter INV2, and an input node of the second inverter INV2 is connected to an output node of the first inverter INV1, so that the first inverter INV1 and the second inverter INV2 constitute one latch circuit.

Referring to FIG. 4B, the integrated circuit device 300 includes an SRAM array 310 including a plurality of SRAM cells 310A, 310B, 310C, and 310D arranged in a matrix on a substrate. FIG. 4B illustrates four SRAM cells 310A, 310B, 310C, and 310D, wherein each memory cell includes six FinFETs. Each of the SRAM cells 310A, 310B, 310C, and 310D may have the circuit configuration illustrated in FIG. 4A.

Each of the SRAM cells 310A, 310B, 310C, and 310D includes a plurality of fin-type active areas FA which protrude from the substrate, e.g., the substrate 110 illustrated in FIGS. 2A to 3R, and which extend in parallel to each other in a direction (Y direction).

In each of the SRAM cells 310A, 310B, 310C and 310D, a plurality of gate lines GL may cover top portions of the fin-type active areas FA and may extend across the fin-type active areas FA. In each of the SRAM cells 310A, 310B, 310C, 310D, intervals between the fin-type active areas FA may be constant or may vary depending on their locations.

In each of the SRAM cells 310A, 310B, 310C, and 310D, the first pull-up transistor PU1, the first pull-down transistor PD1, the first pass transistor PS1, the second pull-up transistor PU2, and the second pull-up transistor PU2 may each be implemented as a FinFET device in which the gate lines GL cross the fin-type active areas FA.

For example, in the SRAM cell 410A, a transistor is formed at each of six intersections of the fin-type active areas FA and the gate lines GL, and the transistors may include the first pass transistor PS1, the second pass transistor PS2, the first pull-down transistor PD1, the second pull-down transistor PD2, the first pull-up transistor PU1, and the second pull-up transistor PU2.

The first pull-up transistor PU1 and the second pull-up transistor PU2 may each include a PMOS transistor, and the first pull-down transistor PD1, the second pull-down transistor PD2, the first pass transistor PS1, and the second pass transistor PS2 may each include an NMOS transistor.

The integrated circuit device 300 may be manufactured by any of the methods described in connection with FIGS. 1 to 3R.

Although the inventive concept has been particularly shown and described with reference to examples thereof, it will be understood that various changes in form and details may be made to the disclosed examples without departing from the spirit and scope of the following claims.

What is claimed is:

1. A method of manufacturing an integrated circuit device, the method comprising:
   forming a carbon-containing film on a substrate;
   forming a silicon-containing organic anti-reflective film on the carbon-containing film, whereby a stacked mask structure constituted by the carbon-containing film and the silicon-containing organic anti-reflective film is formed on the substrate;
   etching the silicon-containing organic anti-reflective film to thereby form a silicon-containing organic anti-reflective pattern that exposes a select portion of the carbon-containing film;
   etching the carbon-containing film using the silicon-containing organic anti-reflective pattern as an etch mask to form a composite mask comprising a carbon-containing mask pattern defining openings therethrough and a profile control liner covering side surfaces of the carbon-containing mask pattern that delimit the openings; and
   implanting ions as an impurity into the substrate through a plurality of spaces defined by the composite mask.

2. The method of claim 1, wherein the carbon-containing film comprises an organic compound having a carbon content of about 85 wt % to about 99 wt % based on a total weight of the organic compound, and
   the silicon-containing organic anti-reflective film comprises a cross-linked polymer having a silicon content of about 10 wt % to about 50 wt %.

3. The method of claim 1, wherein the forming of the silicon-containing organic anti-reflective pattern comprises plasma etching the silicon-containing organic anti-reflective film with a gas containing $C_xF_yH_z$ (where x and y are each an integer of 1 to 10 and z is an integer of 0 to 10).

4. The method of claim 1, wherein the forming of the composite mask comprises plasma-etching the carbon-containing film with an etch gas comprising a sulfur-containing gas, and
   the profile control liner comprises sulfur.

5. The method of claim 4, wherein the sulfur-containing gas comprises COS, $CS_2$, $SO_2$, or a combination thereof.

6. The method of claim 4, wherein the etch gas further comprises $O_2$.

7. The method of claim 4, wherein the etch gas further comprises $O_2$, and
during the plasma-etching of the carbon-containing film, the sulfur-containing gas is supplied at a first flow rate and the $O_2$ is supplied at a second flow rate that is equal to or greater than the first flow rate.

8. The method of claim 1, wherein the composite mask has inner side wall surfaces defining the plurality of spaces, and the inner side wall surfaces are substantially perpendicular to a main surface of the substrate.

9. The method of claim 1, further comprising removing the silicon-containing organic anti-reflective pattern using a first etchant comprising $H_2SO_4$, after the ions have been implanted into the substrate, and
removing the composite mask using a second etchant having a composition different from that of the first etchant.

10. A method of manufacturing an integrated circuit device, the method comprising:
forming a stacked mask structure on a plurality of active areas of a substrate, the stacked mask structure comprising a carbon-containing film and a silicon-containing organic anti-reflective film;
forming a silicon-containing organic anti-reflective pattern by etching the silicon-containing organic anti-reflective film;
forming a composite mask comprising a carbon-containing mask pattern defining openings therethrough and a profile control liner covering side surfaces of the carbon-containing mask pattern that delimit the openings, wherein the composite mask is formed by etching the carbon-containing film using the silicon-containing organic anti-reflective pattern as an etch mask;
implanting ions as an impurity into some of the plurality of active areas using the composite mask as an ion implantation mask; and
removing the silicon-containing organic anti-reflective pattern and the composite mask.

11. The method of claim 10, wherein the substrate has a PMOS transistor area and an NMOS transistor area,
the composite mask is formed to cover one of the PMOS transistor area and the NMOS transistor area but not the other of the PMOS transistor area and the NMOS transistor area; and
the ions are implanted into the other of the PMOS transistor area and the NMOS transistor area.

12. The method of claim 10, wherein the carbon-containing film and the silicon-containing organic anti-reflective film are each formed by spin coating.

13. The method of claim 10, wherein a thickness of the carbon-containing film of the stacked mask structure is about 5 times to about 10 times a thickness of the silicon-containing organic anti-reflective film.

14. The method of claim 10, wherein the silicon-containing organic anti-reflective pattern and the composite mask are formed by a dry etching process using plasma, and
the silicon-containing organic anti-reflective pattern and the composite mask are removed by a wet etching process.

15. The method of claim 10, wherein the forming of the composite mask comprises plasma-etching the carbon-containing film using an etch gas comprising a sulfur-containing gas, and
the profile control liner comprises sulfur derived from the sulfur-containing gas.

16. A method of manufacturing an integrated circuit device, the method comprising:
forming fin-type active areas extending parallel to each other in a first horizontal direction, wherein the fin-type active areas are formed by etching a portion of a substrate;
forming an insulating film filling spaces between adjacent ones of the fin-type active areas;
forming a stacked mask structure on the insulating film and the plurality of fin-type active areas, wherein the stacked mask structure comprises a carbon-containing film and a silicon-containing organic anti-reflective film;
forming a silicon-containing organic anti-reflective pattern by etching the silicon-containing organic anti-reflective film;
forming a composite mask comprising a carbon-containing mask pattern defining openings therethrough and a profile control liner covering side surfaces of the carbon-containing mask pattern that delimit the openings, wherein the composite mask is formed by etching the carbon-containing film using the silicon-containing organic anti-reflective pattern as an etch mask, and
forming a well in the plurality of fin-type active areas by implanting ions as an impurity ion into some of the plurality of fin-type active areas using the composite mask as an ion implantation mask.

17. The method of claim 16, wherein the forming of the composite mask comprises forming a carbon-containing mask pattern by plasma-etching the carbon-containing film using an etching gas comprising a sulfur-containing gas, and
the profile control liner includes sulfur derived from the sulfur-containing gas during the plasma-etching of the carbon-containing film.

18. The method of claim 16, wherein the composite mask is formed by etching the carbon-containing film with an etch gas containing a sulfur-containing gas and $O_2$, and the sulfur-containing gas of the etch gas is included in an amount of about 35 vol % to about 50 vol % based on a total volume of the etch gas.

19. The method of claim 16, further comprising removing the silicon-containing organic anti-reflective pattern and the composite mask after the well has been formed;
removing a portion of the insulating film so as to form a device isolation film covering side wall surfaces of each of the fin-type active areas and allow a top portion of each of the fin-type active areas to protrude above the device isolation film;
forming a gate dielectric film covering a top surface and side walls of each of the fin-type active areas; and
forming a gate line on the gate dielectric film, the gate line covering a top portion of each of the fin-type active areas.

20. The method of claim 19, wherein the removing of the silicon-containing organic anti-reflective pattern and the composite mask comprises:
removing the silicon-containing organic anti-reflective pattern by performing a first wet etch using a first etchant, and
removing the composite mask by performing a second wet etch using a second etchant that is of a different composition from the first etchant.

* * * * *